(12) United States Patent
Kawamura

(10) Patent No.: US 8,673,771 B2
(45) Date of Patent: Mar. 18, 2014

(54) PATTERN FORMING METHOD

(75) Inventor: Daisuke Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/597,014

(22) Filed: Aug. 28, 2012

(65) Prior Publication Data

US 2013/0230981 A1 Sep. 5, 2013

(30) Foreign Application Priority Data

Mar. 1, 2012 (JP) .................................. 2012-45763

(51) Int. Cl.
*H01L 21/00* (2006.01)

(52) U.S. Cl.
USPC .......................................... 438/637; 438/640

(58) Field of Classification Search
USPC ................................. 438/637–640
See application file for complete search history.

(56) References Cited

U.S. PATENT DOCUMENTS

| 7,553,760 B2 * | 6/2009 | Yang et al. ..................... 438/637 |
| 7,592,247 B2 * | 9/2009 | Yang et al. ..................... 438/618 |
| 8,088,687 B2 | 1/2012 | Yeom et al. |
| 2010/0244253 A1 | 9/2010 | Yeom et al. |
| 2012/0074575 A1 | 3/2012 | Yeom et al. |

FOREIGN PATENT DOCUMENTS

| JP | 2010-245494 | 10/2010 |
| JP | 2011-018778 | 1/2011 |
| JP | 2011-077475 | 4/2011 |
| JP | 2012-033534 | 2/2012 |
| WO | WO 2012/014700 A1 | 2/2012 |

* cited by examiner

*Primary Examiner* — Richard Booth
(74) *Attorney, Agent, or Firm* — Finnegan, Henderson, Farabow, Garrett & Dunner, L.L.P.

(57) ABSTRACT

According to one embodiment, a pattern forming method comprises forming, on a metal layer and an insulating layer, an underlying layer the surface state of which is changeable by irradiation with a light ray, radiating the light ray to the underlying layer, thereby changing the surface state of a portion of the underlying layer above the metal layer, forming a block polymer layer on the underlying layer, forming, on the underlying layer, a directed self-assembly phase which contains a first polymer portion and a second polymer portion, the first polymer portion being positioned above the underlying layer portion the surface state of which has been changed by the radiation of the light ray, removing the first polymer portion, and the underlying layer portion underneath the first polymer portion to make a hole, and burying a conductive film into the hole.

19 Claims, 25 Drawing Sheets

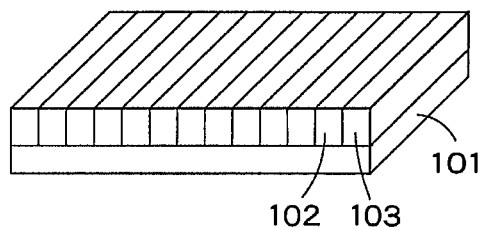
F I G. 1A
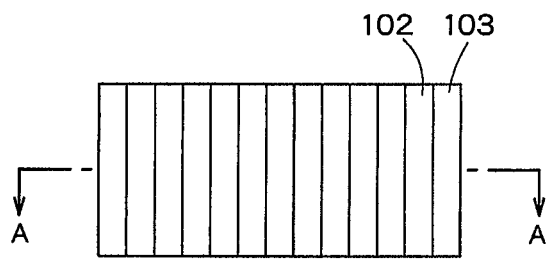
F I G. 1B
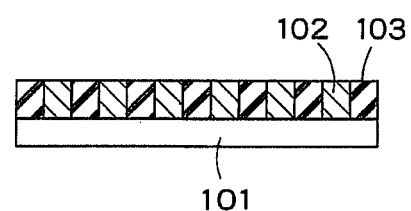
F I G. 1C
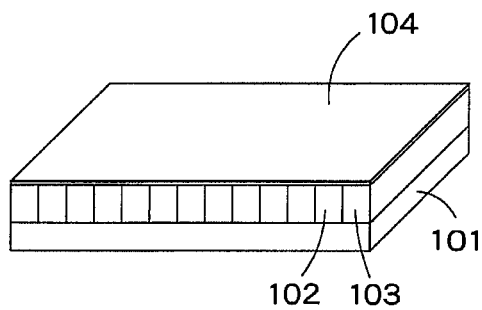
F I G. 2A
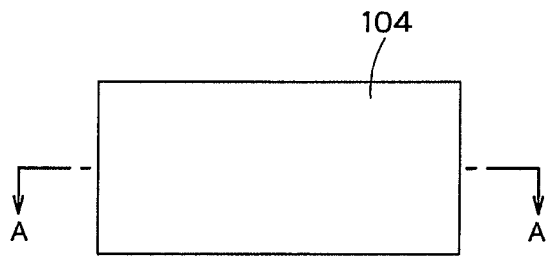
F I G. 2B
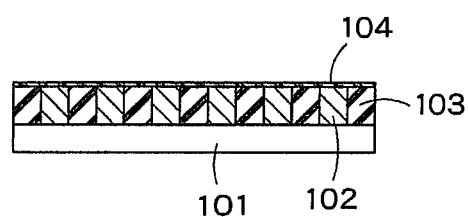
F I G. 2C

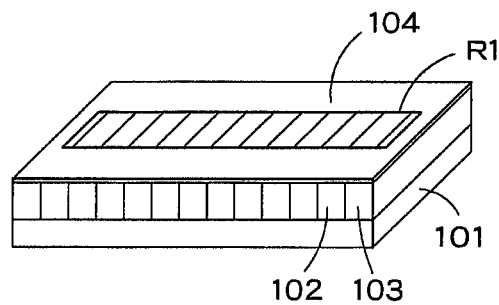
F I G. 3A
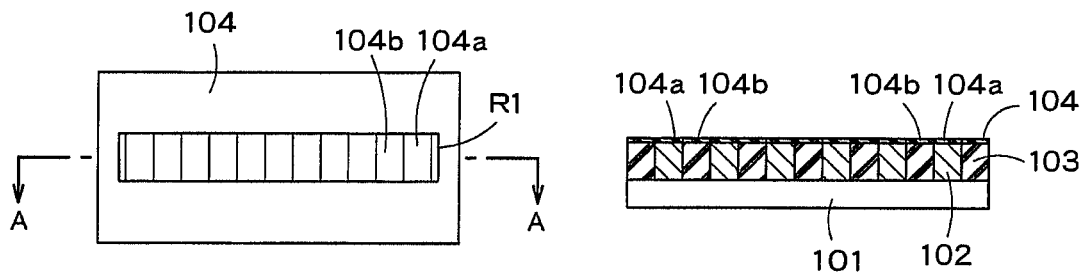
F I G. 3B          F I G. 3C
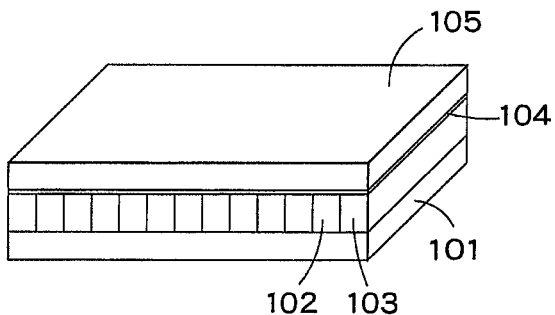
F I G. 4A
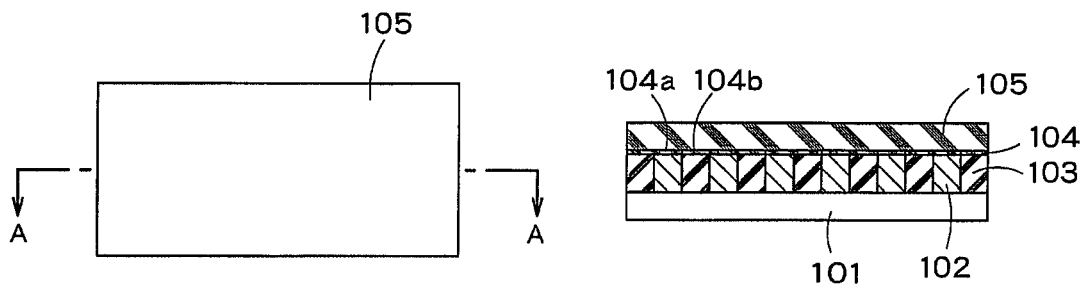
F I G. 4B          F I G. 4C

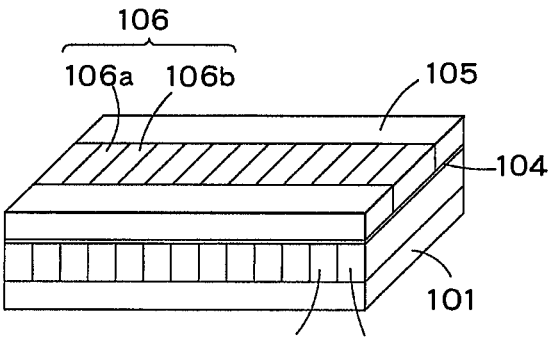
F I G. 5A
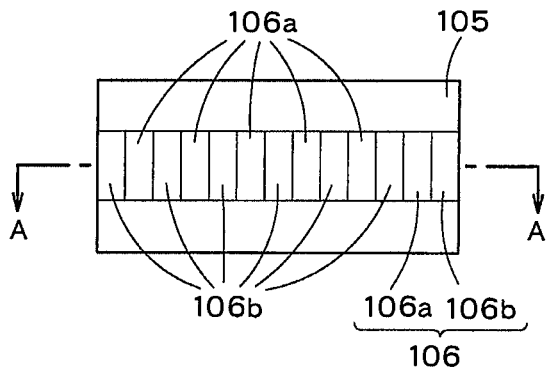
F I G. 5B
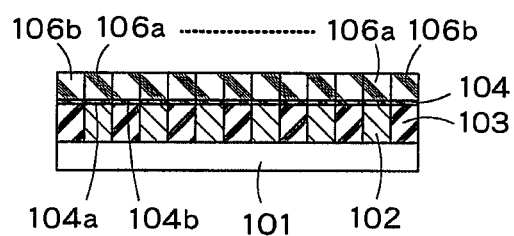
F I G. 5C
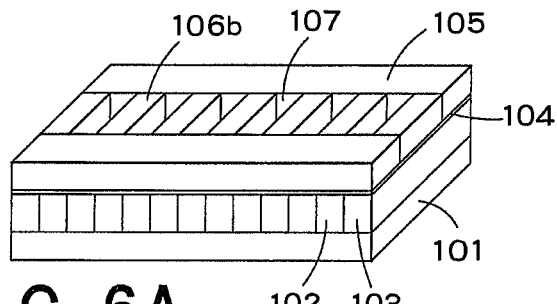
F I G. 6A
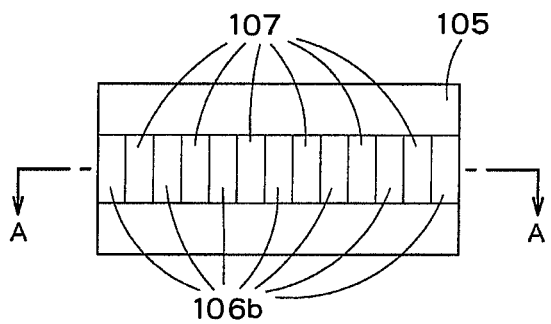
F I G. 6B
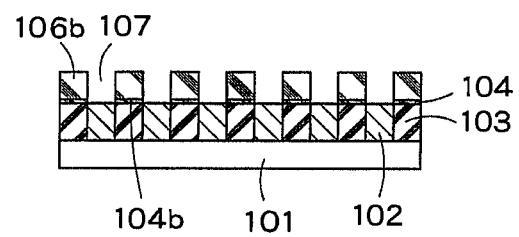
F I G. 6C

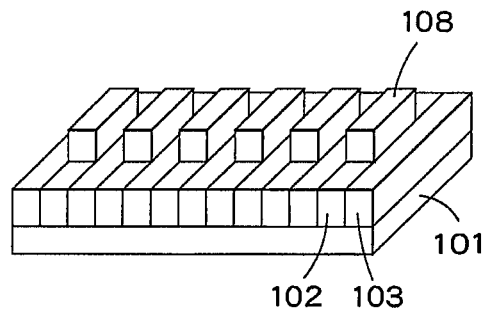
F I G. 9A
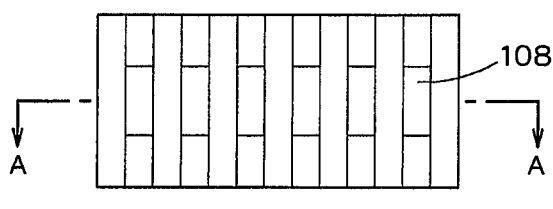
F I G. 9B
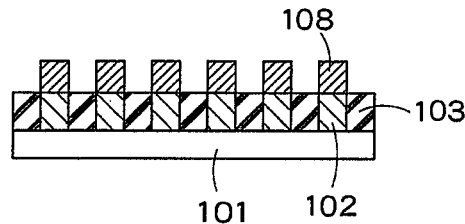
F I G. 9C
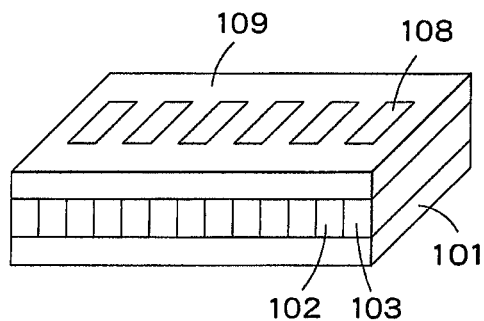
F I G. 10A
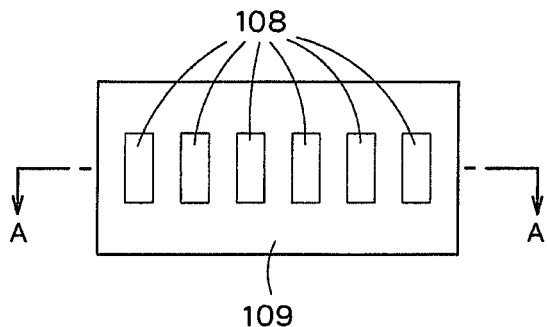
F I G. 10B
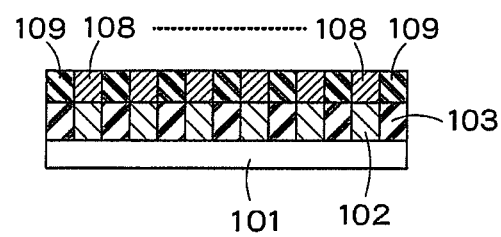
F I G. 10C

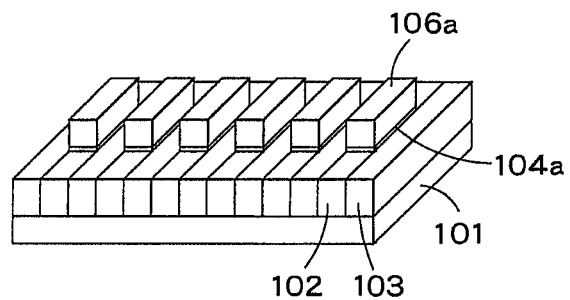
F I G. 11A
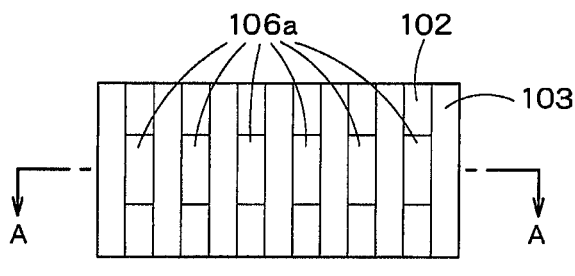
F I G. 11B
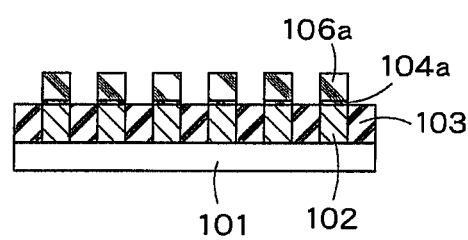
F I G. 11C
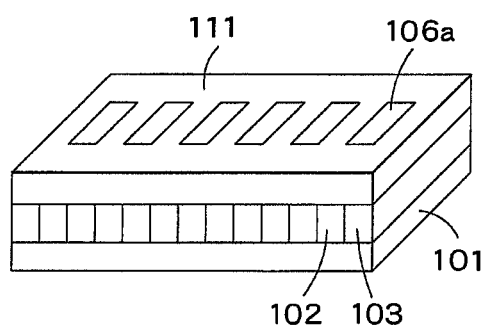
F I G. 12A
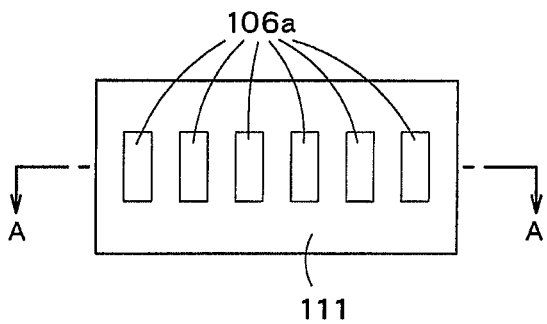
F I G. 12B
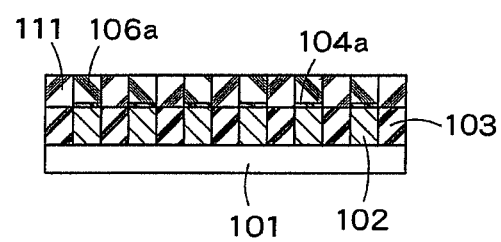
F I G. 12C

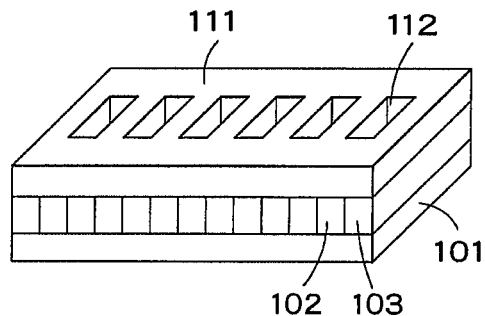
F I G. 13A
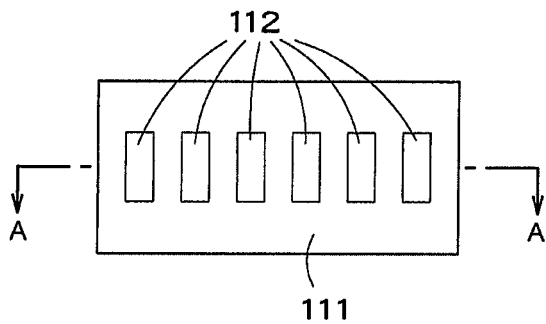
F I G. 13B
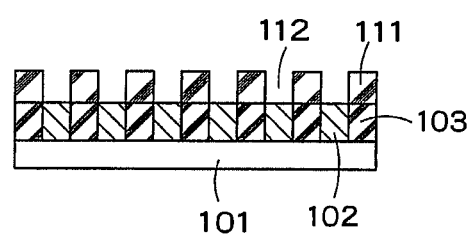
F I G. 13C
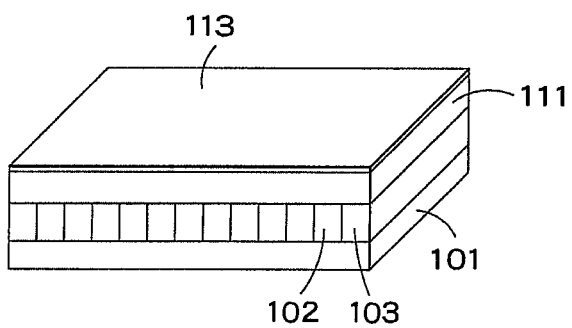
F I G. 14A
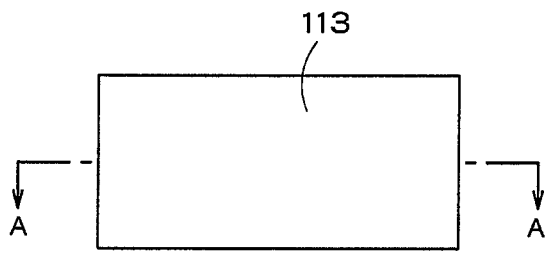
F I G. 14B
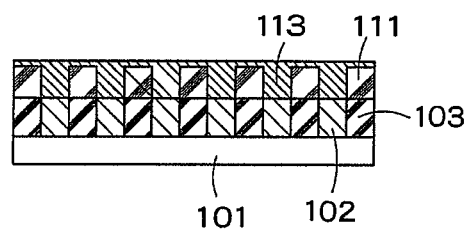
F I G. 14C

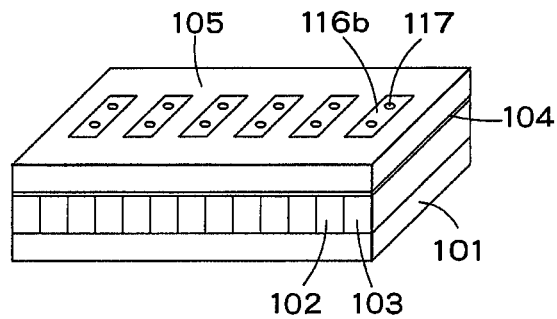
F I G. 17A
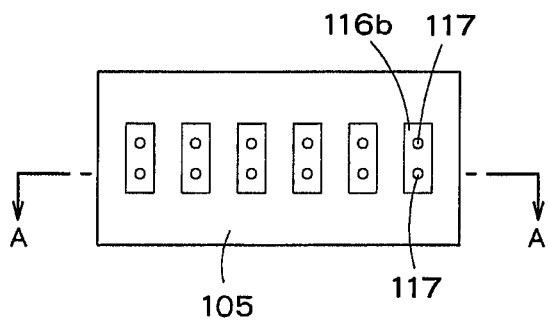
F I G. 17B
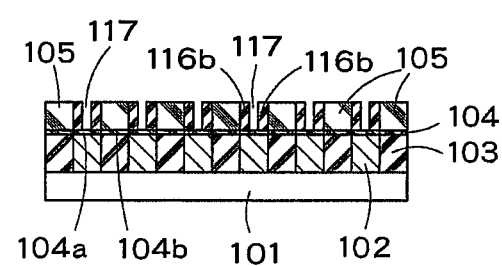
F I G. 17C
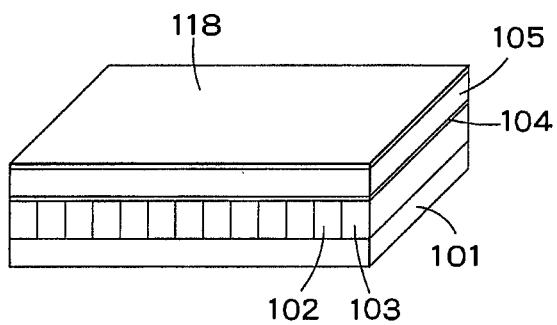
F I G. 18A
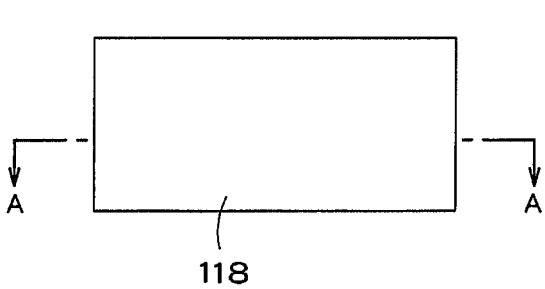
F I G. 18B
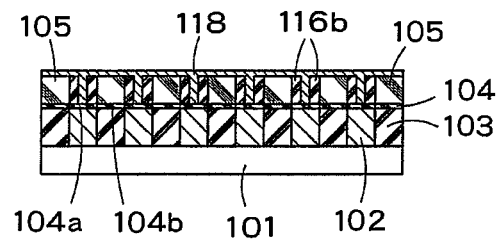
F I G. 18C

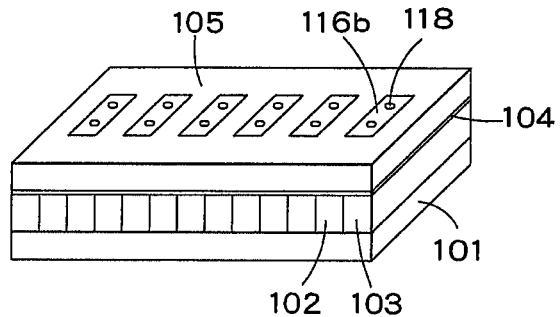
F I G. 19A
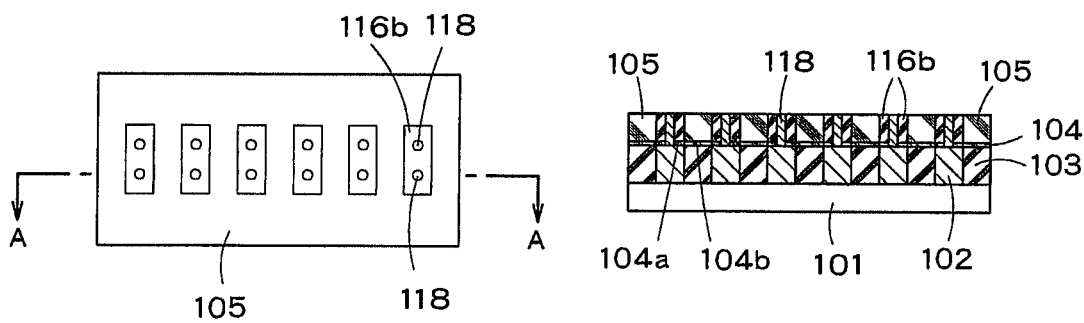
F I G. 19B　　　F I G. 19C
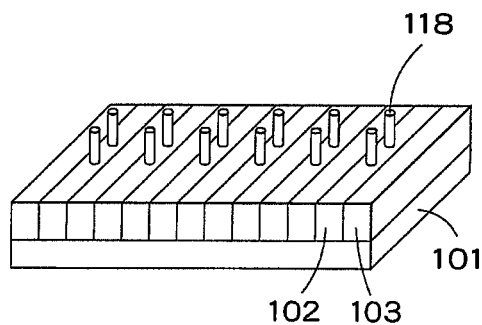
F I G. 20A
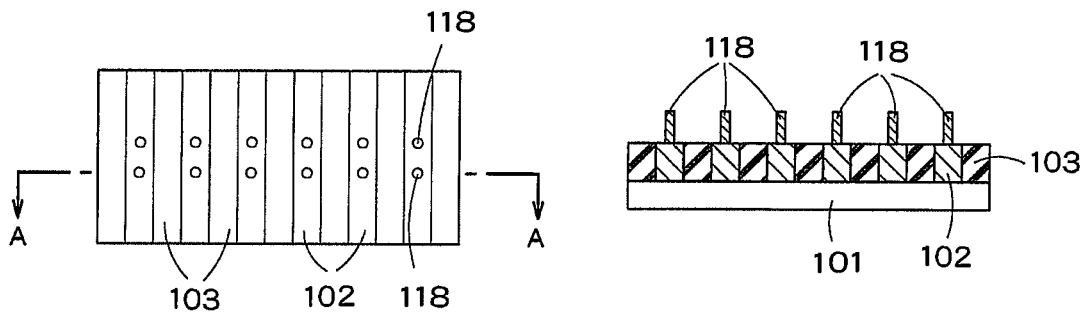
F I G. 20B　　　F I G. 20C

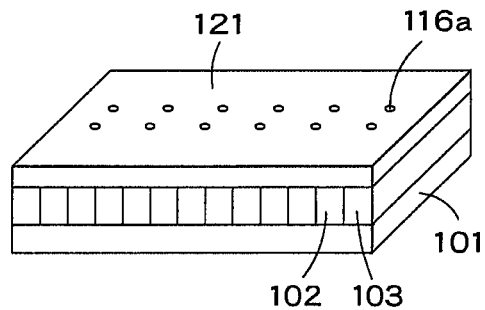
F I G. 23A
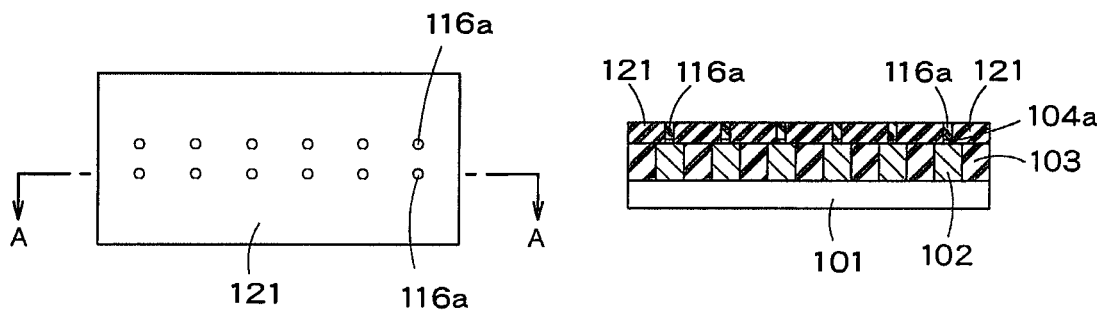
F I G. 23B    F I G. 23C
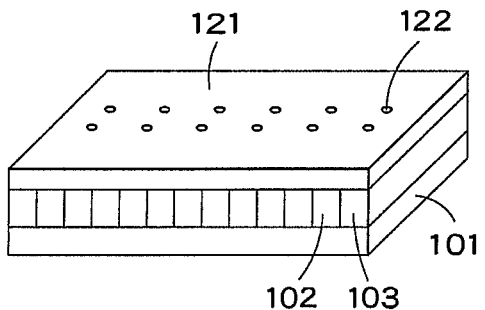
F I G. 24A
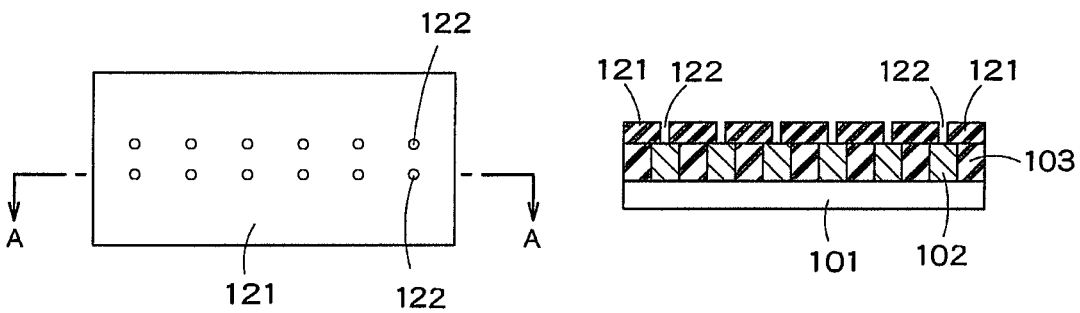
F I G. 24B    F I G. 24C

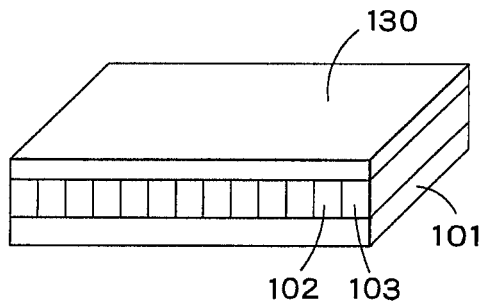
F I G. 27A
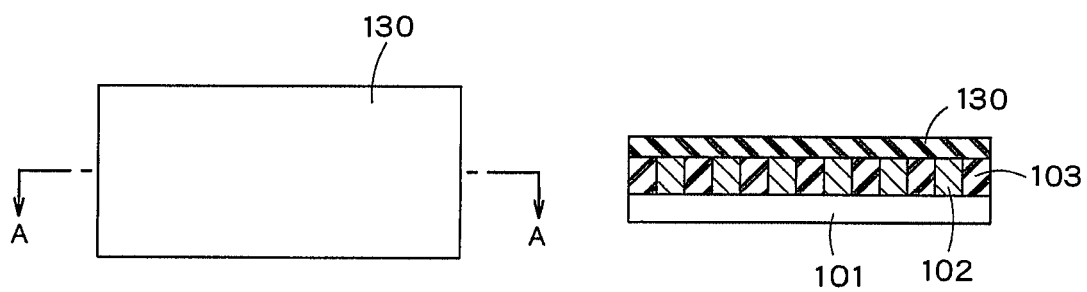
F I G. 27B    F I G. 27C
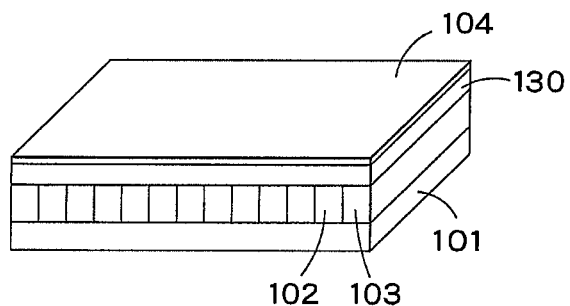
F I G. 28A
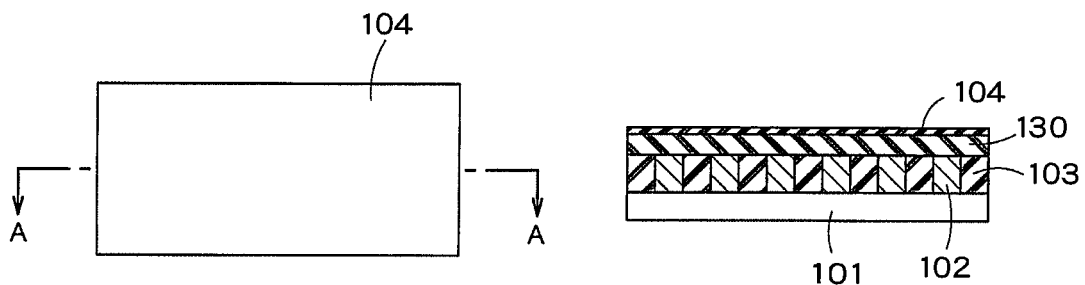
F I G. 28B    F I G. 28C

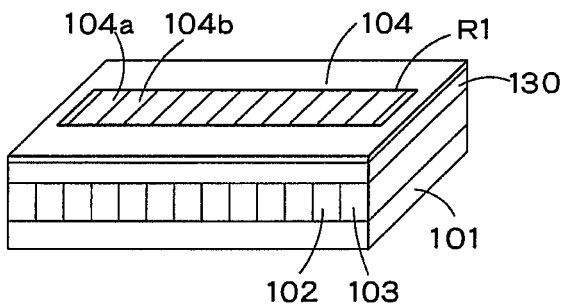
F I G. 29A
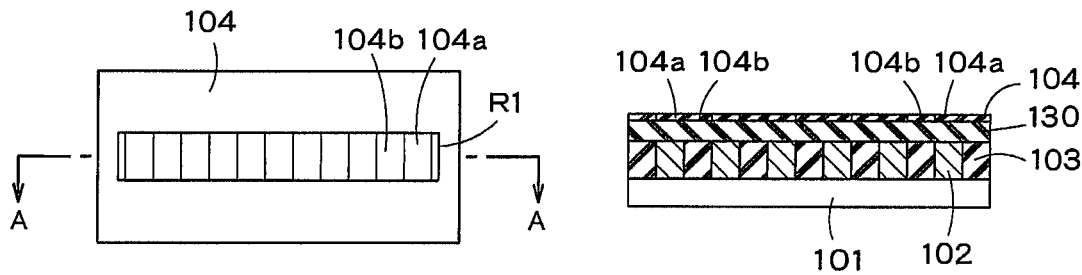
F I G. 29B   F I G. 29C
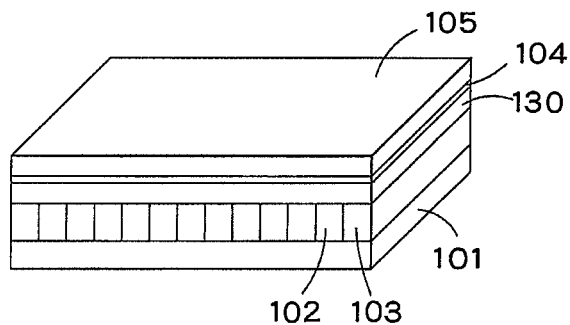
F I G. 30A
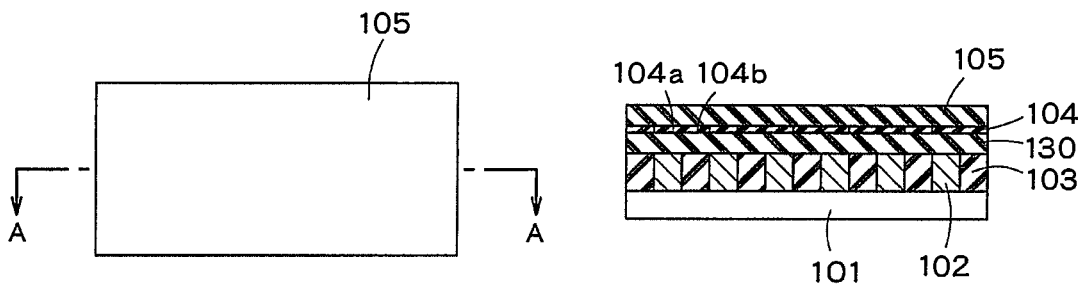
F I G. 30B   F I G. 30C

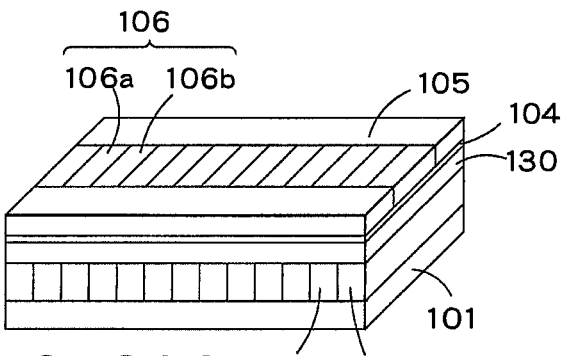
F I G. 31A
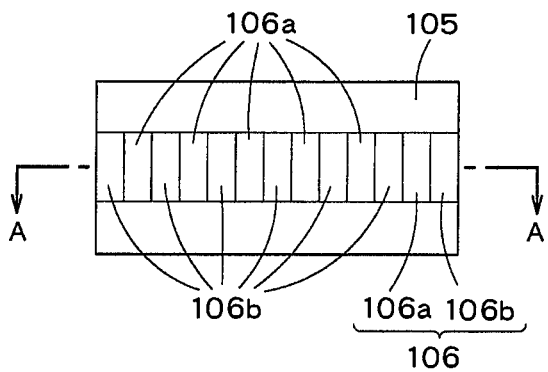
F I G. 31B
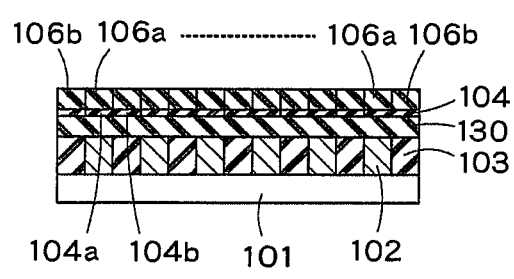
F I G. 31C
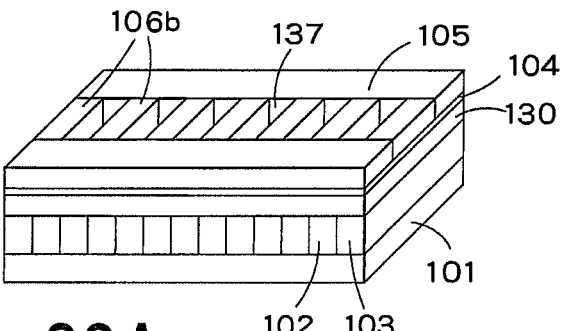
F I G. 32A
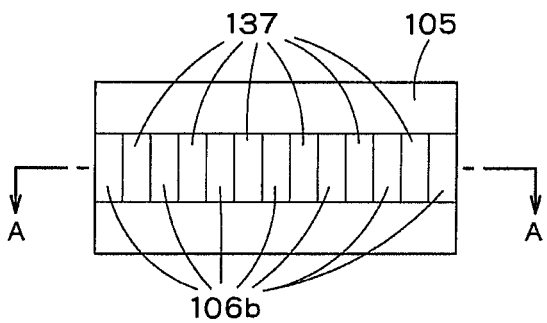
F I G. 32B
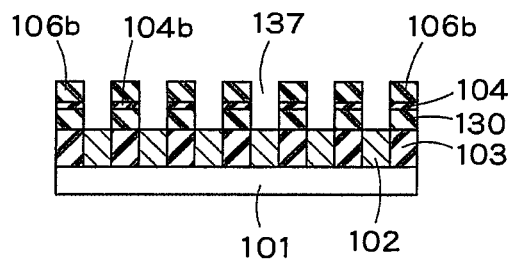
F I G. 32C

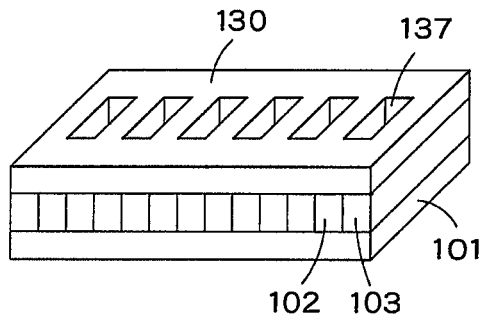
F I G. 33A
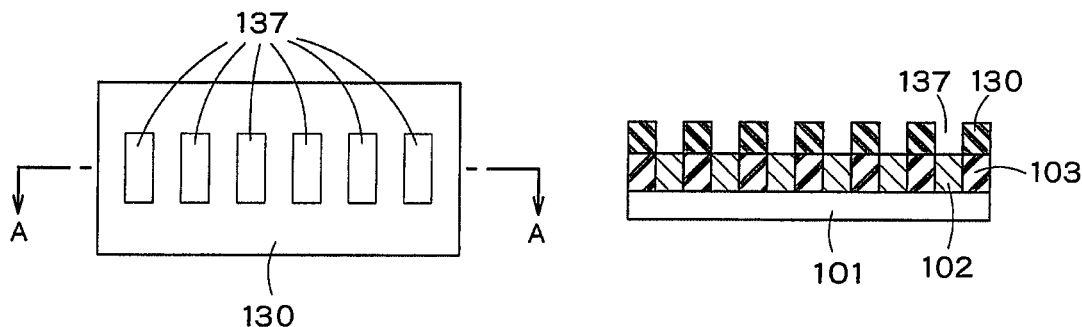
F I G. 33B          F I G. 33C
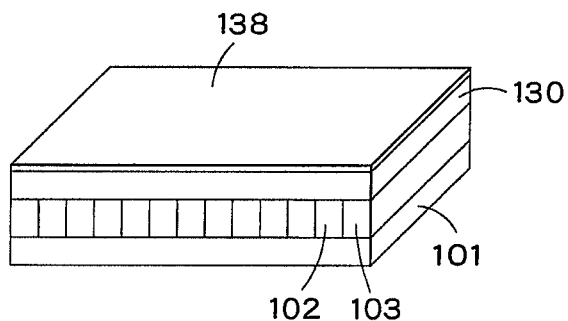
F I G. 34A
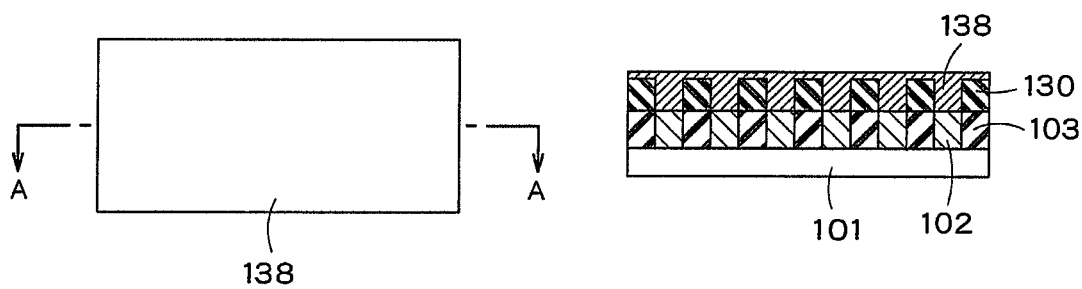
F I G. 34B          F I G. 34C

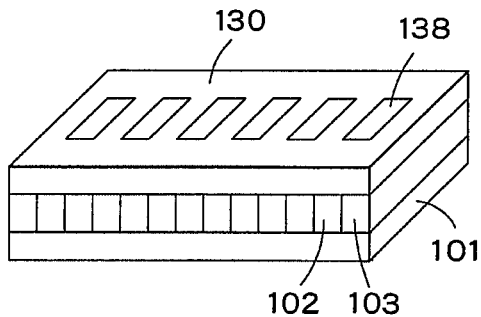
F I G. 35A
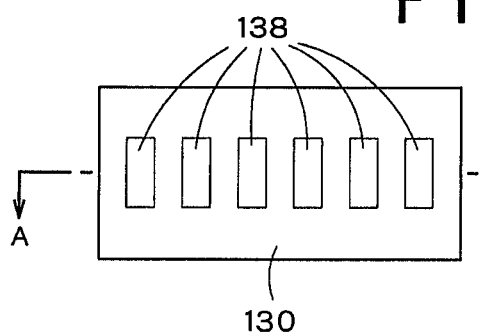
F I G. 35B
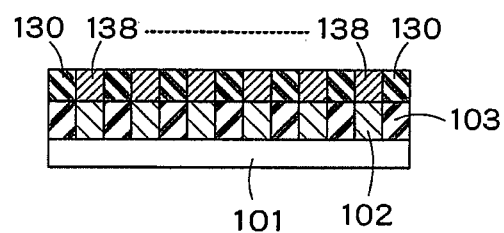
F I G. 35C
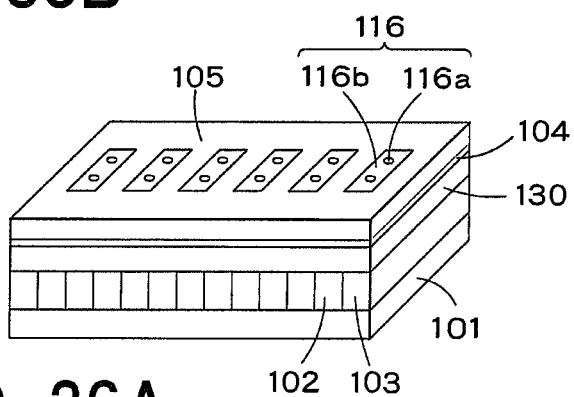
F I G. 36A
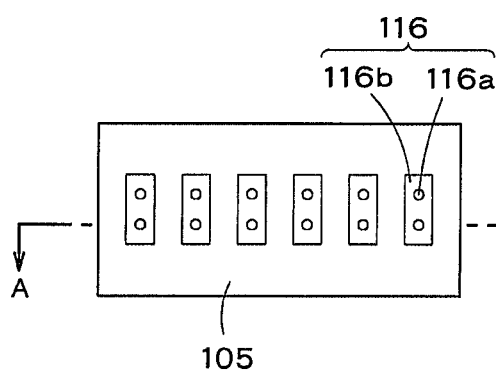
F I G. 36B
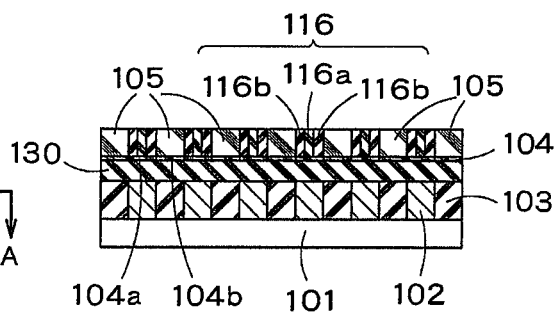
F I G. 36C

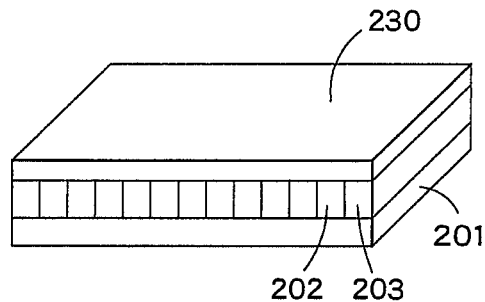
F I G. 41A
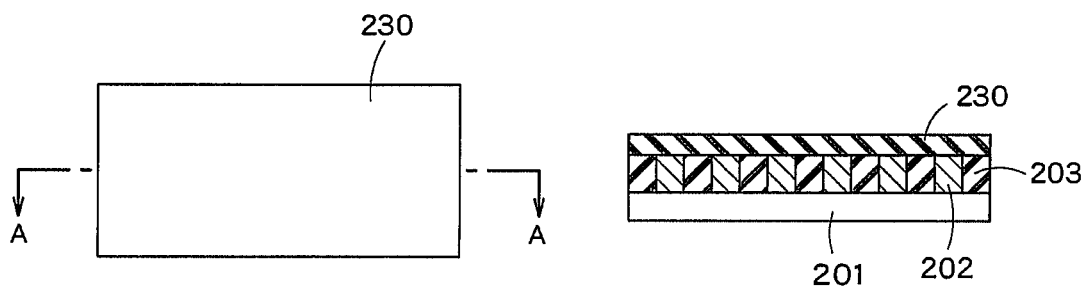
F I G. 41B            F I G. 41C
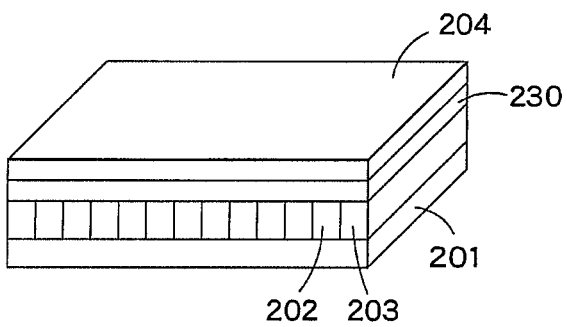
F I G. 42A
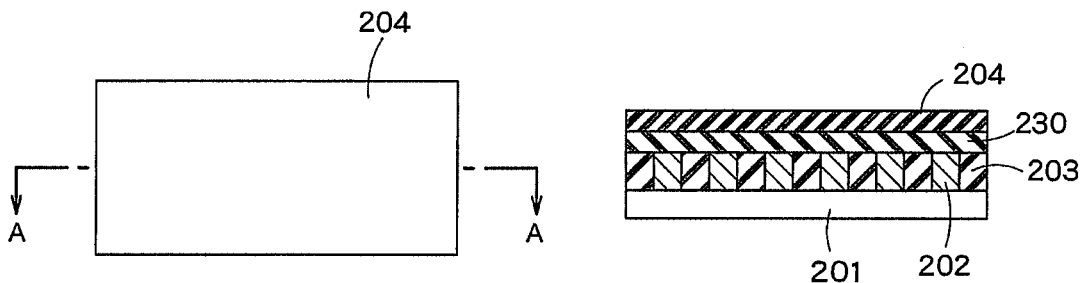
F I G. 42B            F I G. 42C

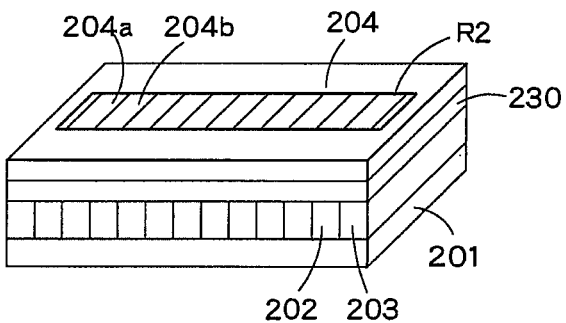
F I G. 43A
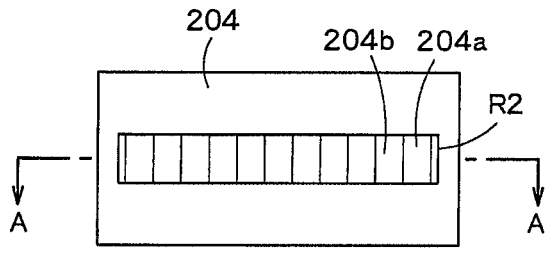
F I G. 43B
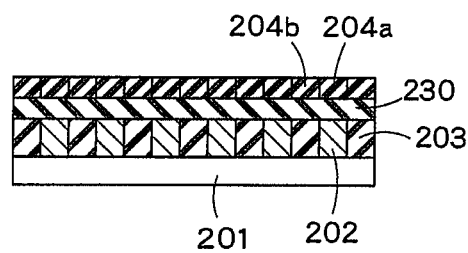
F I G. 43C
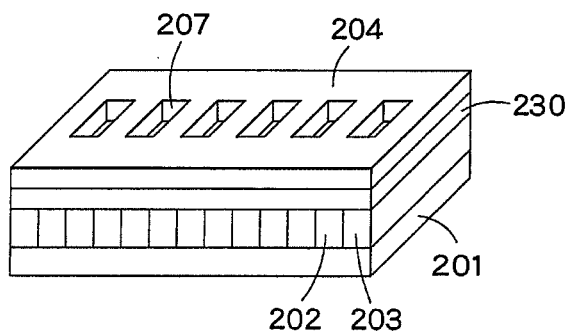
F I G. 44A
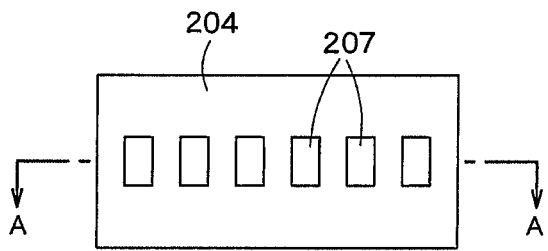
F I G. 44B
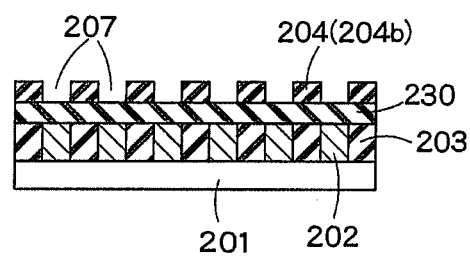
F I G. 44C

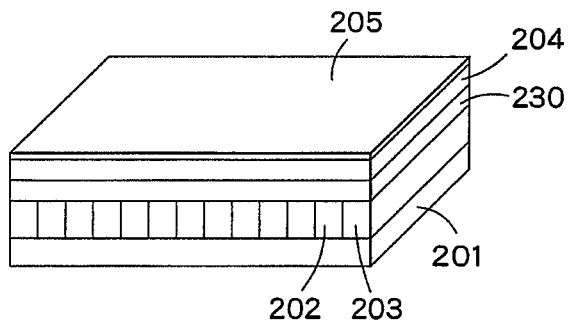
F I G. 45A
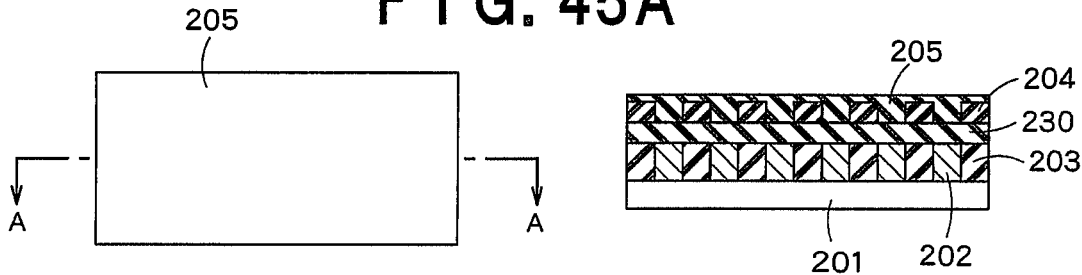
F I G. 45B
F I G. 45C
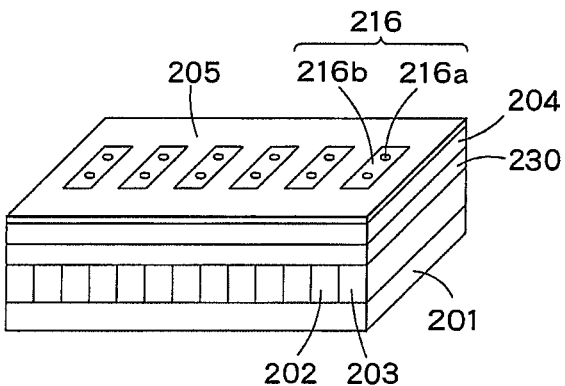
F I G. 46A
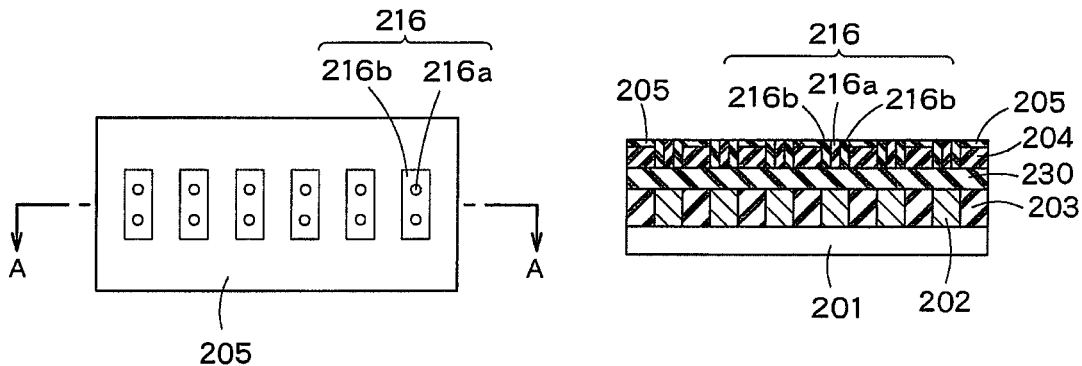
F I G. 46B
F I G. 46C

PATTERN FORMING METHOD

CROSS REFERENCE TO RELATED APPLICATION

This application is based upon and claims benefit of priority from the Japanese Patent Application No. 2012-45763, filed on Mar. 1, 2012, the entire contents of which are incorporated herein by reference.

FIELD

Embodiments described herein relate generally to a pattern forming method.

BACKGROUND

As a lithographic technique in a process for producing a semiconductor element, known are double patterning technique based on ArF-immersion lithography, EUV lithography, nano-imprinting lithography, and others. Such conventional lithographic techniques have various problems, such as an increase in costs, a hard spec in overlay, and a high target in throughput, which follow the shrinking of patterns.

Under such a situation, it is expected that a directed self-assembly (DSA) phenomenon is applied to lithography. A directed self-assembly phase is generated by thermal energy stabilization, which is a spontaneous behavior; thus, a pattern high in dimensional precision can be formed. In particular, a technique using a phase separation of a block-polymer makes it possible to form a periodic structure of units having a shape that may be of various types and each having a size of several nanometers to several hundreds of nanometers by a simple and easy coating and an annealing process. In accordance with the content ratio between individual blocks in the polymeric block copolymer, the microdomain structure thereof is varied into, for example, a spherical, columnar or lamellar form, and in accordance with the molecular weight thereof, the size is varied, so that holes, pillars, and line patterns that may have various dimensions can be formed.

In order to use DSA to form a desired pattern over a wide area, it is necessary to lay a guide layer for controlling the generation position of a directed self-assembly phase. As the guide layer, the following are known: a physical guide layer (grapho-epitaxy) having an irregularity structure wherein a microphase separation pattern is formed in fine concaves; and a chemical guide layer (chemical-epitaxy) formed as an underlying layer underneath a DSA material to control the formation position of a phase separation pattern in accordance with the surface state of this layer.

However, when the formation position or size of such a guide layer is out of a desired position or size, the generation position of a directed self-assembly phase is shifted to an undesired position, or is not formed, resulting in a problem that a desired pattern is not obtained.

BRIEF DESCRIPTION OF THE DRAWINGS

FIGS. 1A, 1B and 1C are a perspective view, a top view and a sectional view, respectively, illustrating a step in a pattern forming method according to a first embodiment;

FIGS. 2A, 2B and 2C are views subsequent to FIGS. 1A, 1B and 1C;

FIGS. 3A, 3B and 3C are views subsequent to FIGS. 2A, 2B and 2C;

FIGS. 4A, 4B and 4C are views subsequent to FIGS. 3A, 3B and 3C;

FIGS. 5A, 5B and 5C are views subsequent to FIGS. 4A, 4B and 4C;

FIGS. 6A, 6B and 6C are views subsequent to FIGS. 5A, 5B and 5C;

FIGS. 9A, 9B and 9C are views subsequent to FIGS. 8A, 8B and 8C;

FIGS. 10A, 10B and 10C are views subsequent to FIGS. 9A, 9B and 9C;

FIGS. 11A, 11B and 11C are a perspective view, a top view and a sectional view, respectively, illustrating a step in a pattern forming method according to a second embodiment;

FIGS. 12A, 12B and 12C are views subsequent to FIGS. 11A, 11B and 11C;

FIGS. 13A, 13B and 13C are views subsequent to FIGS. 12A, 12B and 12C;

FIGS. 14A, 14B and 14C are views subsequent to FIGS. 13A, 13B and 13C;

FIGS. 17A, 17B and 17C are views subsequent to FIGS. 16A, 16B and 16C;

FIGS. 18A, 18B and 18C are views subsequent to FIGS. 17A, 17B and 17C;

FIGS. 19A, 19B and 19C are views subsequent to FIGS. 18A, 18B and 18C;

FIGS. 20A, 20B and 20C are views subsequent to FIGS. 19A, 19B and 19C;

FIGS. 23A, 23B and 23C are views subsequent to FIGS. 22A, 22B and 22C;

FIGS. 24A, 24B and 24C are views subsequent to FIGS. 23A, 23B and 23C;

FIGS. 27A, 27B and 27C are a perspective view, a top view and a sectional view, respectively, illustrating a step in a pattern forming method according to a fifth embodiment;

FIGS. 28A, 28B and 28C are views subsequent to FIGS. 27A, 27B and 27C;

FIGS. 29A, 29B and 29C are views subsequent to FIGS. 28A, 28B and 28C;

FIGS. 30A, 30B and 30C are views subsequent to FIGS. 29A, 29B and 29C;

FIGS. 31A, 31B and 31C are views subsequent to FIGS. 30A, 30B and 30C;

FIGS. 32A, 32B and 32C are views subsequent to FIGS. 31A, 31B and 31C;

FIGS. 33A, 33B and 33C are views subsequent to FIGS. 32A, 32B and 32C;

FIGS. 34A, 34B and 34C are views subsequent to FIGS. 33A, 33B and 33C;

FIGS. 35A, 35B and 35C are views subsequent to FIGS. 34A, 34B and 34C;

FIGS. 36A, 36B and 36C are a perspective view, a top view and a sectional view, respectively, illustrating a step in a pattern forming method according to a sixth embodiment;

FIGS. 41A, 41B and 41C are a perspective view, a top view and a sectional view, respectively, illustrating a step in a pattern forming method according to a seventh embodiment;

FIGS. 42A, 42B and 42C are views subsequent to FIGS. 41A, 41B and 41C;

FIGS. 43A, 43B and 43C are views subsequent to FIGS. 42A, 42B and 42C;

FIGS. 44A, 44B and 44C are views subsequent to FIGS. 43A, 43B and 43C;

FIGS. 45A, 45B and 45C are views subsequent to FIGS. 44A, 44B and 44C;

FIGS. 46A, 46B and 46C are views subsequent to FIGS. 45A, 45B and 45C;

DETAILED DESCRIPTION

Figure 7A:
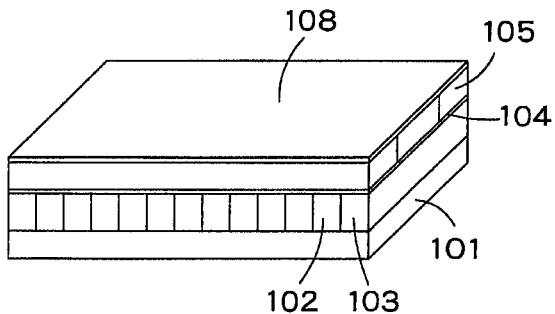
FIGS. 7A, 7B and 7C are views subsequent to FIGS. 6A, 6B and 6C.

According to one embodiment, a pattern forming method comprises forming, on a metal layer and an insulating layer, an underlying layer the surface state of which is changeable by irradiation with a light ray, radiating the light ray to the underlying layer, thereby changing the surface state of a portion of the underlying layer above the metal layer, forming a block polymer layer on the underlying layer, forming, on the underlying layer, a directed self-assembly phase which contains a first polymer portion and a second polymer portion, the first polymer portion being positioned above the underlying layer portion the surface state of which has been changed by the radiation of the light ray, removing the first polymer portion, and the underlying layer portion underneath the first polymer portion to make a hole, and burying a conductive film into the hole.

Embodiments will now be explained with reference to the accompanying drawings.

(First Embodiment)

With reference to FIGS. 1A, 1B and 1C to FIGS. 10A, 10B and 10C, a description will be made about a pattern forming method according to a first embodiment of the embodiments. In each group of the figures with the same number, the figure with A is a perspective view, that with B is a top view, and that with C is a sectional view taken on line A-A in the figure B.

First, as illustrated in FIGS. 1A to 1C, plural patterned pieces of an interconnect layer 102 are formed on a semiconductor substrate 101. The interconnect layer 102 is, for example, a metal layer which is made of (or contains) copper, aluminum, tungsten, titanium, or an alloy containing one or more of these metals. The interconnect layer 102 constitutes a line-and-space pattern along a predetermined direction (vertical direction in FIG. 1B). An insulating layer 103 is formed in space areas (areas between the individual patterned pieces of the interconnect layer 102). For the insulating layer 103, use may be made of, for example, SiOC, SiOF, or a porous silicon material such as porous silica. For the insulating layer 103, an applied SOG (spin-on-glass) may be used.

Next, as illustrated in FIGS. 2A to 2C, an underlying layer 104 is formed on the interconnect layer 102 and the insulating layer 103. The underlying layer 104 is to function as an undercoat for a block copolymer which is to be formed in a subsequent step. In the underlying layer 104, its area is changed in surface state when irradiated with a light ray having a predetermined wavelength. For example, the underlying layer 104 has hydrophobicity before irradiated with the light ray, and when the light ray is radiated onto its area, the area is changed into hydrophilicity. The underlying layer 104 may be, for example, a laminated film composed of a self-assembled monolayer (SAM), and a polymer layer. A specific example of the SAM is a layer of a silane coupling agent containing a benzophenone skeleton. The polymer may be a (meth)acrylic resin derivative. After the SAM and the polymer are made into a laminate structure, the light ray is radiated onto its desired area and then the polymer is removed with, for example, a solvent wherein the polymer is soluble. By the radiation of the light ray, crosslinkage is generated between the benzophenone structure and the polymer contacting the structure so that the surface of the light-radiated area turns into a state originating from the polymer. By using, as the polymer, a hydrophilic resin such as (meth) acrylic resin, the light-radiated area can be made into a hydrophilic state. The method for forming the membrane of the polymer may be any application of a solution containing the polymer, and a solvent wherein the polymer is soluble. When the polymer is (meth) acrylic resin, the solvent wherein the polymer is soluble may be, for example, an aromatic hydrocarbon, a cycloalkane, an alkyl alcohol, an alkyl ester, or an alkyl ketone. It is advisable that a solvent to be used to remove the polymer membrane is made identical to the solvent in the solution to be applied.

Next, as illustrated in FIGS. 3A to 3C, a photomask (not illustrated) is used to expose predetermined regions R1 of the underlying layer 104 to a light ray. The light ray radiated is a light ray to which the underlying layer 104 is photosensitive. Examples thereof include light rays of wavelengths from UV to DUV wavelengths (such as 365 nm, 248 nm, and 193 nm). The predetermined regions R1 correspond to regions where contacts with the interconnect layer 102 are to be formed.

When the pitch p of the patterned pieces of the interconnect layer 102 is ½ of the radiated wavelength λ, or more (p≥λ/2), in the whole of the underlying layer 104, contrast is generated in the photosensitivity thereof. Specifically, the light ray radiated onto the underlying layer 104 is reflected on the interconnect layer 102 and the insulating layer 103 underneath the underlying layer 104. The reflectivity of the light ray on the interconnect layer 102 is higher than that of the light ray on the insulating layer 103. For this reason, in the underlying layer 104 inside the predetermined regions R1, overlying portions 104a on the interconnect layer 102 are higher in photosensitivity than overlying portions 104b on the insulating layer 103. Accordingly, about the underlying layer 104, by exposing the predetermined regions R1 to the light ray, the surface state of the overlying portions 104a on the interconnect layer 102 and inside the predetermined regions R1 is largely changed while the surface state of the overlying portions 104b on the insulating layer 103 and inside the predetermined regions R1, as well as the surface state of an unexposed portion (region other than the predetermined regions R1) 104c, is scarcely changed or is not changed.

In a case where the underlying layer 104 has, for example, a property that "the layer exhibits hydrophobicity before irradiated with the light ray, and when irradiated with the light ray to be enhanced in photosensitivity, the layer is changed into hydrophilicity," the exposure of the predetermined regions R1 to the light changes the overlying portions 104a on the interconnect layer 102 and inside the predetermined regions R1 into hydrophilicity, so that in the predetermined regions R1, the overlying portions 104b on the insulating layer 103, and the unexposed portion 104c are kept, as they are, in the hydrophobic state.

When the workpiece is irradiated with a light ray having TM polarizability in a direction perpendicular to the direction along which the interconnect layer 102 is extended, evanescent light (near field light) is generated above the interconnect layer 102. The evanescent light makes high the photosensitivity of the overlying portions 104a on the interconnect layer 102 and inside the predetermined regions R1. When the radiated wavelength and the pitch of the patterned pieces of the interconnect layer 102 are, for example, 193 nm, and less than 20 nm, respectively, near fields from both edges of the patterned pieces of the interconnect layer 102 are bonded to each other to generate evanescent light. When the radiated wavelength, the numerical aperture of the projecting optical system (concerned), and the half pitch of a pattern to be formed are represented by $\lambda$, NA and hp, respectively, the following relationship is satisfied: $hp \geq 0.25\lambda/NA$. In ordinary projection exposure, ¼ of the half pitch (concerned) is resolution limit. However, evanescent light makes it possible to form a finer pattern.

As described above, through the step illustrated in FIGS. 3A to 3C, in the underlying layer 104, only the overlying portions 104a on the interconnect layer 102 and inside the exposed regions R1 are changed in surface state. The underlying layer 104 after the exposure treatment has a function as a chemical guide layer for controlling the following when a block copolymer to be formed in a subsequent step is to undergo microphase separation: the formation position of a pattern of the microphase separation.

Next, as illustrated in FIGS. 4A to 4C, a block copolymer is applied onto the underlying layer 104 to form a block polymer layer 105. The applied block copolymer may be a diblock copolymer wherein first polymer block chains are bonded to second polymer block chains. The diblock copolymer may be a block copolymer of polystyrene (PS) and polymethyl methacrylate (PMMA).

Next, as illustrated in FIGS. 5A to 5C, in the block polymer layer 105, a directed self-assembly phase 106 based on phase separation is formed. The directed self-assembly phase 106 is in such a lamellar form that thin-plate-form first polymer portions 106a each containing one of the first polymer block chains, and thin-plate-form second polymer portions 106b each containing one of the second polymer block chains are alternately arranged. This lamellar directed self-assembly phase 106 is formed by a matter that the underlying layer 104, which has the portions 104a the surface state of which has been changed by the light exposure and the portions the surface state of which has been not changed, functions as a chemical guide layer.

The directed self-assembly phase 106 is formed on the underlying layer 104 and inside the predetermined regions R1. The directed self-assembly phase 106 has a cyclic structure which has starting-points as upper sites of the underlying layer 104 inside the predetermined regions R1, and which is extended in the right and left directions in FIG. 5B. In regions having no chemical guide layer (the upper end region and the lower end region in FIG. 5B), no phase separation is not generated, so that the directed self-assembly phase 106 is not formed. Thus, these regions are kept in a disordered phase.

The average molecular weight of the first polymer block chains of the diblock copolymer applied in the step illustrated in FIGS. 4A to 4C, as well as that of the second polymer block chains thereof, is made into a value permitting the first polymer portions 106a to be formed on the portions 104a of the underlying layer 104, the surface state of the portions 104a having been changed by the light exposure. Moreover, the first polymer portions 106a are made lower than the second polymer portions 106b in etch resistance.

In the case of using, for example, a block copolymer of polystyrene (PS) and polymethyl methacrylate (PMMA), heating of the workpiece at 150 to 200° C. for 30 seconds to 30 minutes permits the formation of the lamellar directed self-assembly phase 106, wherein the thin-plate-form first polymer portions 106a each containing polymethyl methacrylate (PMMA), and the thin-plate-form second polymer portions 106b each containing polystyrene (PS) are alternately arranged. Polymethyl methacrylate (PMMA) is high in affinity with a hydrophilic membrane; thus, the thin-plate-form first polymer portions 106a containing polymethyl methacrylate (PMMA) are formed on the portions 104a of the underlying layer 104, the surface state of the portions 104a having been changed by the light exposure.

Next, as illustrated in FIGS. 6A to 6C, while the second polymer portions 106b and the block polymer layer (disordered phase) 105 are caused to remain, the first polymer portions 106a, which are relatively low in etch resistance, are selectively removed. After the removal of the first polymer portions 106a, the underlying layer 104 portions (104a) positioned underneath the first polymer portions 106a are also removed. In this way, holes 107 making the upper surface of the interconnect layer 102 (precisely, the respective upper surfaces of the pieces of the interconnect layer 102) naked are made.

In, for example, dry etching based on oxygen plasma, polymethyl methacrylate (PMMA) is higher in etch rate than polystyrene (PS); thus, the first polymer portions 106a containing polymethyl methacrylate (PMMA) can be selectively removed. The first polymer portions 106a can be selectively removed also by, for example, EB radiation, VUV radiation, or organic developing treatment with an organic solvent such as butyl acetate.

Figure 7B:
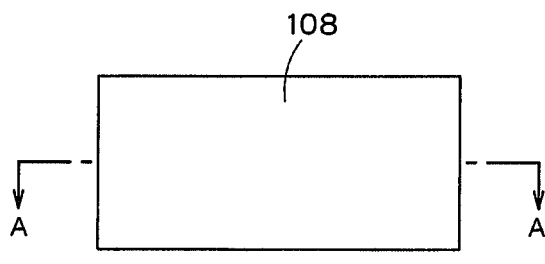
Figure 7C:
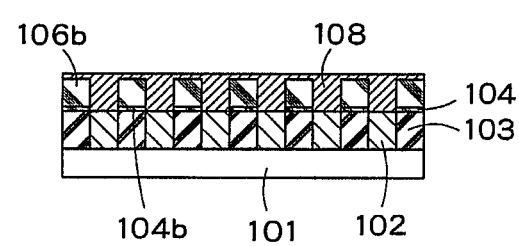

Next, as illustrated in FIGS. 7A to 7C, a conductive film 108 is formed to be buried in the holes 107. For the conductive film 108, use may be made of, for example, copper, aluminum, tungsten or titanium.

Figure 8A:
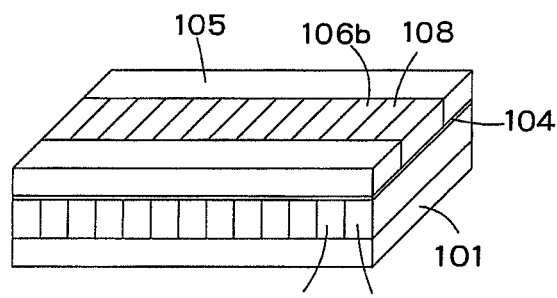
FIGS. 8A, 8B and 8C are views subsequent to FIGS. 7A, 7B and 7C.
Figure 8B:
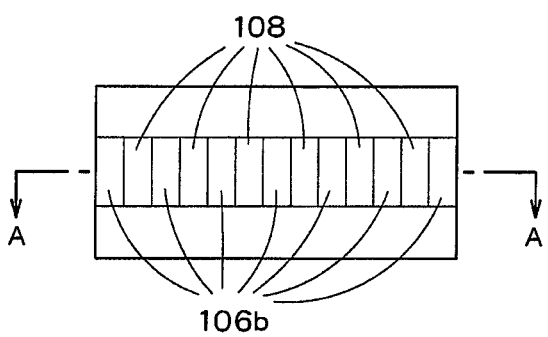
Figure 8C:
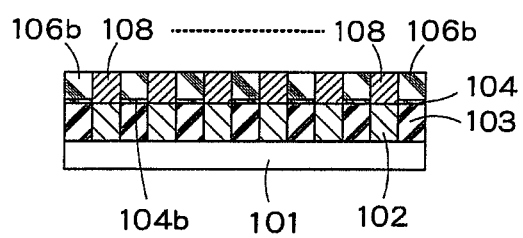

Next, as illustrated in FIGS. 8A to 8C, conductive film 108 portions formed above the insulating film 103, which are other than the film 108 portions in the holes 107, are removed. By, for example, lifting-off, the conductive film 108 portions other than the film 108 portions in the holes 107 can be removed. The conductive film 108 buried in the holes 107 functions as contacts with the interconnect layer 102.

Next, as illustrated in FIGS. 9A to 9C, while the conductive film 108 is caused to remain, the block polymer layer 105, the second polymer portions 106b, and the underlying layer 104 are removed. By, for example, dry etching based on oxygen plasma, the block polymer layer 105, the second polymer portions 106b, and the underlying layer 104 can be removed. In this way, the respective surfaces of the interconnect layer 102, the insulating layer 103 and the conductive film 108 are made naked.

Next, as illustrated in FIGS. 10A to 10C, an insulating layer 109 is formed to cover the interconnect layer 102, the insulating layer 103, and the conductive film 108, and then the upper surface of the conductive film 108 is made naked. For the insulating layer 109, use may be made of, for example, SiOC, SiOF, or a porous silicon material such as porous silica.

In the present embodiment, at the time of exposing the underlying layer 104 to the light ray, reflective light from the interconnect layer 102 and/or evanescent light is/are used to change the surface state of the underlying layer 104 portions positioned on the interconnect layer 102. In other words, a pattern of the chemical guide layer based on the microphase separation of the block polymer layer 105 can be formed in the manner of self-alignment to (the patterned pieces of) the interconnect layer 102. For this reason, the position and the size of the chemical guide layer can be heightened in precision. Thus, the directed self-assembly phase 106 can be formed as a desired directed self-assembly phase. Moreover, contacts with a high precision in position and size can be formed to be fitted also to fine interconnects having a narrow (or small) pitch.

In the first embodiment, the material of the block polymer layer 105 may be a material permitting the formation of the directed self-assembly phase 106 that is a phase in which organic microphases and insulating microphases which are each in a thin-plate-form are alternately arranged. The organic microphases correspond to the first polymer portions 106a, and the insulating microphases correspond to the second polymer portions 106b. This material may be, for example, a material composed of an organic block polymer, and a silicon-containing block polymer having a siloxane structure or some other structures; examples of this material include a mixture of PS-PDMS diblock copolymer and PDMS polymer, and a mixture of PS-PEO diblock copolymer and PEO polymer. In the directed self-assembly phase, the silicon-containing microphases exhibit electrically insulating property. The disordered phase wherein no microphase separation is caused also exhibits electrically insulating property. The PS microphases, which are organic microphases, are lower in etch resistance than PEO and PDMS.

The use of such a material for the block polymer layer 105 makes it unnecessary to remove the block polymer layer 105 and form the insulating layer 109 after the conductive film 108 is buried. Accordingly, the steps correspond to FIGS. 9 and 10 can be omitted so that the number of steps can be reduced.

(Second Embodiment)

In the first embodiment, etch resistance is low in the first polymer portions 106a formed on the portions 104a of the underlying layer 104, these portions 104a having been changed in surface state. However, the first polymer portions 106a may be portions higher in etch resistance than the second polymer portions 106b, and the block polymer layer 105 wherein no microphase separation is caused (disordered phase).

In the case of using, as the block polymer, PS-PMMA in the same way as in the first embodiment, a microphase separation phase formed in exposed portions of an underlying film can be changed by changing the state of the exposed portions of the underlying film. A polymer film to be formed on the above-mentioned benzophenone-skeleton-containing monomolecular directed self-assembly film may be a polystyrene film. By applying a solution containing polystyrene, and a solvent wherein this polymer is soluble onto the benzophenone-skeleton-containing monomolecular directed self-assembly film, a polystyrene film is formed. By exposing predetermined regions thereof to a light ray, the benzophenone structure and polystyrene are polymerized. Next, the workpiece is treated with a solution wherein polystyrene is soluble, thereby removing polystyrene in any portion other than the exposed portions. Subsequently, an underlying film is formed to cause a polymer similar in surface state to the block copolymer to remain in the exposed portions, thereby making it possible to form a directed self-assembly phase 106 wherein first polymer portions 106a high in etch resistance are positioned on an underlying layer 104a the surface state of which has been changed.

With reference to FIGS. 11A-11C to FIGS. 15A-15C, a description will be made about a pattern forming method according to the present embodiment (second embodiment) of the invention. In FIG. 11, as well as any other three figures with the same number out of FIG. 12 to FIG. 15, the figure with A is a perspective view, that with B is a top view, and that with C is a sectional view taken on line A-A in the figure B.

The step of forming a directed self-assembly phase 106, and steps before this step are the same as in the first embodiment (see FIG. 1 to FIG. 5); thus, description thereof is omitted.

After the formation of the directed self-assembly 106, as illustrated in FIGS. 11A to 11C, while the first polymer portions 106a are caused to remain, the second polymer portions 106b, the block polymer layer 105, and the underlying layer 104 portions positioned underneath the portions 106b and the layer 105 are removed. For example, by dry etching based on oxygen plasma, the block polymer layer 105, the second polymer portions 106b, and the underlying layer 104 portions can be removed. In this way, the respective surfaces of the interconnect layer 102, the insulating layer 103, and the first polymer portions 106a are made naked.

Next, as illustrated in FIGS. 12A to 12C, an insulating layer 111 is formed to cover the interconnect layer 102, the insulating layer 103 and the first polymer portions 106a, and subsequently the upper surfaces of the first polymer portions 106a are made naked. For the insulating layer 111, use may be made of, for example, SiOC, SiOF, or a porous silicon material such as porous silica.

Next, as illustrated in FIGS. 13A to 13C, while the insulating layer 111 is caused to remain, the first polymer portions 106a are selectively removed. After the removal of the first polymer portions 106a, underlying layer 104 portions (104a) positioned underneath the first polymer portions 106a are also removed. In this way, holes 112 making the upper surface of the interconnect layer 102 naked are made. The first polymer portions 106a can be removed by, for example, dry etching based on oxygen plasma.

Next, as illustrated in FIGS. 14A to 14C, a conductive film 113 is formed to be buried in the holes 112. For the conductive film 113, use may be made of, for example, copper, aluminum, tungsten or titanium.

Figure 15A:
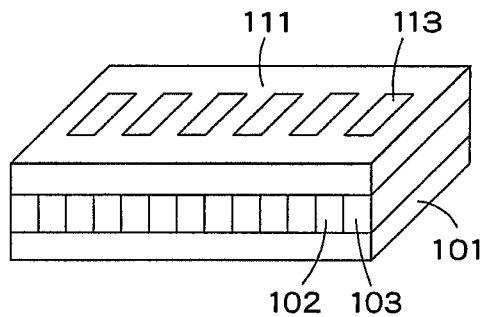
FIGS. 15A, 15B and 15C are views subsequent to FIGS. 14A, 14B and 14C.
Figures 15B, 15C:
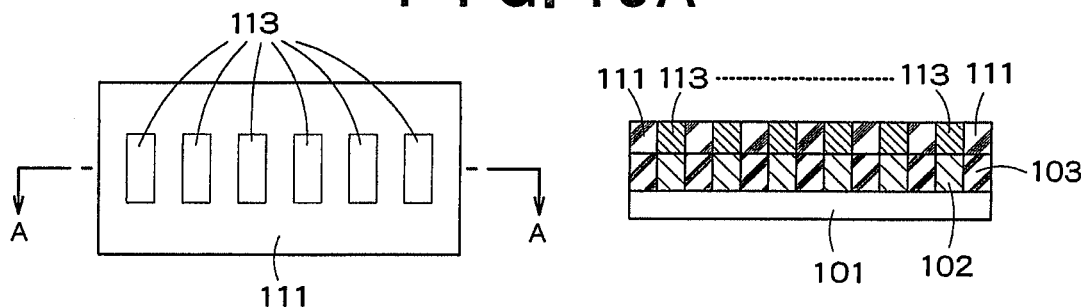

Next, as illustrated in FIGS. 15A to 15C, conductive film 113 portions other than the film 113 portions in the holes 112 are removed. By, for example, chemical mechanical polishing (CMP) using the insulating layer 111 as a stopper, the conductive film 113 portions other than the film 113 portions in the holes 112 can be removed. The conductive film 113 buried in the holes 112 functions as contacts with the interconnect layer 102.

In the same manner as in the first embodiment, in the present embodiment, at the time of exposing the underlying layer 104 to the light ray, reflective light from the interconnect layer 102 and/or evanescent light is/are used to change the surface state of the underlying layer 104 portions positioned on the interconnect layer 102. In other words, a pattern of the chemical guide layer based on the microphase separation of the block polymer layer 105 can be formed in the manner of self-alignment to (the patterned pieces of) the interconnect layer 102. For this reason, the position and the size of the chemical guide layer can be heightened in precision. Thus, the directed self-assembly phase 106 can be formed as a desired directed self-assembly phase. Thus, interconnect contacts can be formed with a high precision in position and size.

(Third Embodiment)

In the first embodiment, the lamellar directed self-assembly phase 106 is formed by the microphase separation of the block polymer layer 105. However, a cylindrical directed self-assembly phase may be formed. The shape of the periodic structure of the directed self-assembly phase can be varied, for example, by changing the content ratio between the first polymer block chains and the second polymer block chains contained in the diblock copolymer.

With reference to FIGS. 16A-16C to FIGS. 21A-21C, a description will be made about a pattern forming method according to the present embodiment (third embodiment) of the invention. In FIG. 16, as well as any other three figures with the same number out of FIG. 17 to FIG. 21, the figure with A is a perspective view, that with B is a top view, and that with C is a sectional view taken on line A-A in the figure B.

The step of forming a block polymer layer 105, and steps before this step are the same as in the first embodiment (see FIG. 1 to FIG. 4); thus, description thereof is omitted.

Figure 16A:
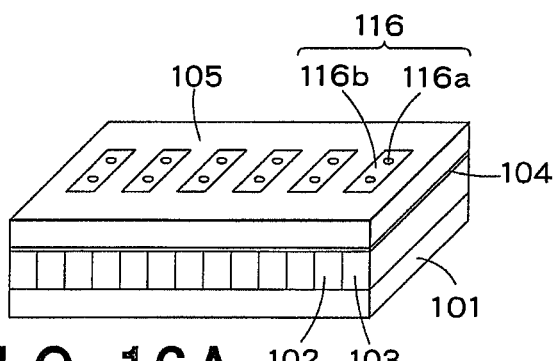
FIGS. 16A, 16B and 16C are a perspective view, a top view and a sectional view, respectively, illustrating a step in a pattern forming method according to a third embodiment.
Figures 16B, 16C:
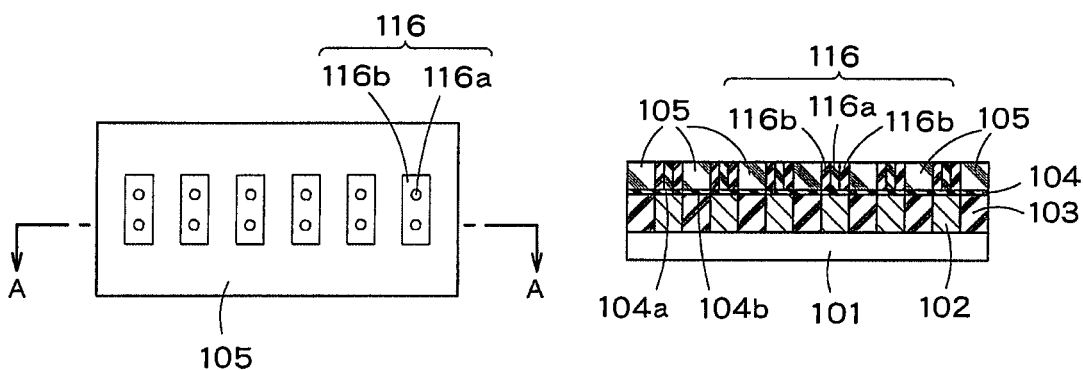

After the formation of the block polymer layer 105, as illustrated in FIGS. 16A to 16C, a directed self-assembly phase 116 based on microphase separation is formed in the block polymer layer 105 by, for example, heating treatment. The directed self-assembly phase 116 has cylindrical first polymer portions 116a containing first polymer block chains, and second polymer portions 116b containing second polymer block chains and formed to surround the respective first polymer portions 116a. This directed self-assembly phase 116 is formed by a matter that portions 104a the surface state of which has been changed by the light exposure function as a chemical guide layer. The directed self-assembly phase 116 is formed on the underlying layer portions 104a of the underlying layer 104, these underlying layer portions 104a having been changed in surface state by the light exposure, inside the predetermined regions R1. In regions where no chemical guide layer is formed (overlying regions on the underlying layer 104 portions the surface state of which has not been changed), no microphase separation is not generated, so that the directed self-assembly phase 116 is not formed. The first polymer portions 116a are made lower in etch resistance than the second polymer portions 116b, and the block polymer layer 105 wherein no microphase separation is caused (disordered phase 105).

In the embodiment, the number of the cylindrical first polymer portions 116a is set to two. However, the number may be one, or three or more.

Next, as illustrated in FIGS. 17A to 17C, while the second polymer portions 116b, and the block polymer layer 105 are caused to remain, the first polymer portions 116a, which are relatively low in etch resistance, are selectively removed. After the removal of the first polymer portions 116a, the underlying layer 104 portions (104a) positioned underneath the first polymer portions 116a are also removed. In this way, cylindrical holes 117 making the upper surface of the interconnect layer 102 naked are made. For example, by dry etching based on oxygen plasma, the first block polymer portions 116a can be selectively removed.

Next, as illustrated in FIGS. 18A to 18C, a conductive film 118 is formed to be buried in the holes 117. For the conductive film 118, use may be made of, for example, copper, aluminum, tungsten or titanium.

Next, as illustrated in FIGS. 19A to 19C, conductive film 118 portions other than the film 118 portions in the holes 117 are removed. By, for example, lifting-off, the conductive film 118 portions other than the film 118 portions in the holes 117 can be removed. The conductive film 118 buried in the holes 117 functions as contacts with the interconnect layer 102.

Next, as illustrated in FIGS. 20A to 20C, while the conductive film 118 is caused to remain, the block polymer layer 105, the second polymer portions 116b, and the underlying layer 104 are removed. By, for example, dry etching based on oxygen plasma, the block polymer layer 105, the second polymer portions 116b, and the underlying layer 104 can be removed. In this way, the respective surfaces of the interconnect layer 102, the insulating layer 103, and the conductive film 118 can be made naked.

Figure 21A:
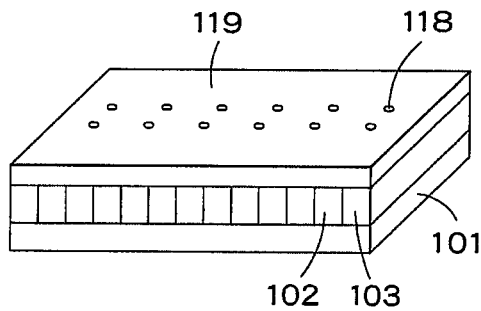
FIGS. 21A, 21B and 21C are views subsequent to FIGS. 20A, 20B and 20C.
Figures 21B, 21C:
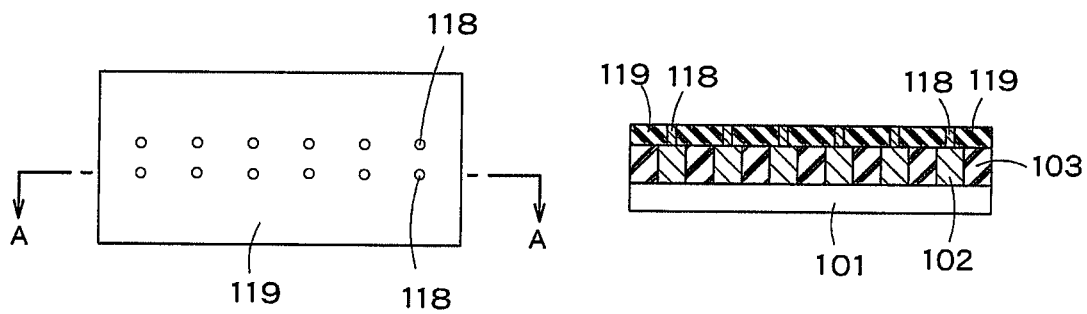

Next, as illustrated in FIGS. 21A to 21C, an insulating layer 119 is formed to cover the interconnect layer 102, the insulating layer 103, and the conductive film 118. Thereafter, the upper surface of the conductive film 118 is made naked. For the insulating layer 119, use may be made of, for example, SiOC, SiOF, or a porous silicon material such as porous silica.

In the same manner as in the first embodiment, in the present embodiment, at the time of exposing the underlying layer 104 to the light ray, reflective light from the interconnect layer 102 and/or evanescent light is/are used to change the surface state of the underlying layer 104 portions positioned on the interconnect layer 102. In other words, a pattern of the chemical guide layer based on the microphase separation of the block polymer layer 105 can be formed in the manner of self-alignment to (the patterned pieces of) the interconnect layer 102. For this reason, the position and the size of the chemical guide layer can be heightened in precision. Thus, the directed self-assembly phase 116 can be formed at a desired position. As a result, interconnect contacts can be formed with a high precision in position and size.

In the third embodiment, the material of the block polymer layer 105 may be a material permitting the formation of the directed self-assembly phase 116 that is a phase having cylindrical organic microphases and insulating microphases each surrounding one of the organic microphases. The material may be a material composed of an organic block polymer, and a silicon-containing block polymer having a siloxane structure or some other structures; examples of this material include a mixture of PS-PDMS diblock copolymer and PDMS polymer, and a mixture of PS-PEO diblock copolymer and PEO polymer. In the directed self-assembly phase, the silicon-containing microphases exhibit electrically insulating property. The disordered phase wherein no microphase separation is caused also exhibits electrically insulating property. In the above-mentioned material, the PS microphases form the cylindrical microphases; thus, the block polymer of PDMS or PEO (plus polymer additives) is rendered a material larger in the number of monomer molecules than the PS block polymer. The PS microphases, which are organic microphases, are lower in etch resistance than PEO or PDMS.

The use of such a material for the block polymer layer 105 makes it unnecessary to remove the block polymer layer 105 and form the insulating layer 119 after the conductive film 118 is buried. Accordingly, the steps correspond to FIGS. 20 and 21 can be omitted so that the number of steps can be reduced.

In the third embodiment, the material of the block polymer layer 105 may be a material permitting the cylindrical first polymer portions 116a of the directed self-assembly phase 116 to become conductive microphases. Before the formation of the block polymer layer 105, by removing the portions 104a of the underlying layer 104, these portions 104a having been changed in surface state by the light exposure, inside the predetermined regions R1 to make the upper surface of the interconnect layer 202 naked, the first polymer portions 116a function as contacts with the interconnect layer 202. In this case, after the formation of the directed self-assembly phase 116, the second polymer portions 116b and the block polymer layer 105 are removed while the first polymer portions (conductive microphases) 116a are caused to remain; and subsequently an insulating layer is formed on the interconnect layer 102 and the insulating layer 103 to surround the first polymer portions (conductive microphases) 116a. The use of such a material for the block polymer layer 105 makes it possible to form contacts with the interconnect layer 102 without forming any hole nor burying a conductive film in any hole. Accordingly, the number of steps can be reduced.

(Fourth Embodiment)

In the third embodiment, the cylindrical first polymer portions 116a are low in etch resistance. However, the first polymer portions 116a may be higher in etch resistance than the second polymer portions 116b, and the block polymer layer 105 wherein no microphase separation is caused.

With reference to FIGS. 22A-22C to FIGS. 26A-26C, a description will be made about a pattern forming method according to the present embodiment (fourth embodiment) of the invention. In FIG. 22, as well as any other three figures with the same number out of FIG. 23 to FIG. 26, the figure with A is a perspective view, that with B is a top view, and that with C is a sectional view taken on line A-A in the figure B.

The step of forming a directed self-assembly phase 116, and steps before this step are the same as in the first or third embodiment (see FIG. 1 to FIG. 5, and FIG. 16). Thus, description thereof is omitted.

Figure 22A:
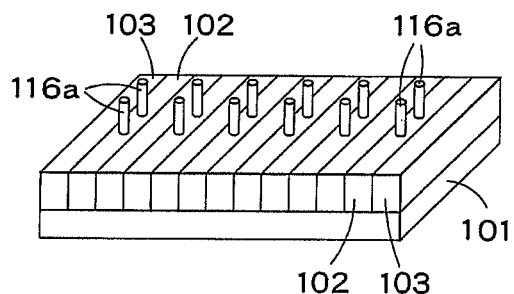
FIGS. 22A, 22B and 22C are a perspective view, a top view and a sectional view, respectively, illustrating a step in a pattern forming method according to a fourth embodiment.
Figures 22B, 22C:
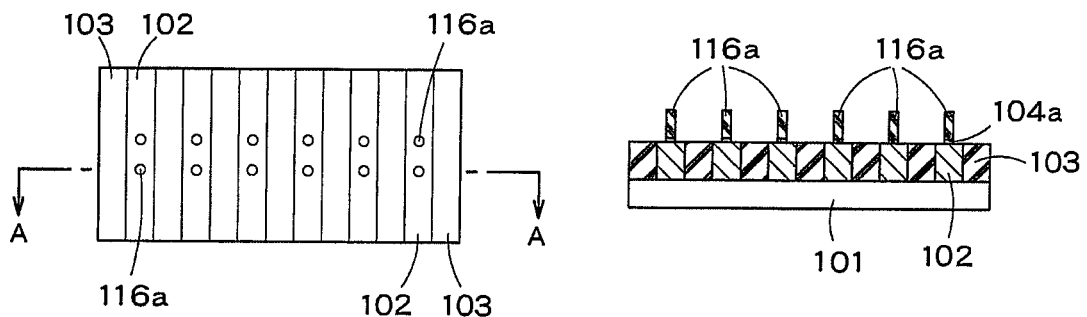

After the formation of the directed self-assembly phase 116, as illustrated in FIGS. 22A to 22C, while the first polymer portions 116a are caused to remain, the second polymer portions 116b, the block polymer layer 105, and the underlying layer 104 portions positioned underneath the portions 116 and the layer 105 are removed. By, for example, dry etching based on oxygen plasma, the block polymer layer 105, the second polymer portions 116b, and the underlying layer 104 portions can be removed. In this way, the respective surfaces of the interconnect layer 102, the insulating layer 103 and the first polymer portions 116a are made naked.

Next, as illustrated in FIGS. 23A to 23C, an insulating layer 121 is formed to cover the interconnect layer 102, the insulating layer 103, and the first polymer portions 116a. Thereafter, the upper surfaces of the first polymer portions 116a are made naked. For the insulating layer 121, use may be made of, for example, SiOC, SiOF, or a porous silicon material such as porous silica.

Next, as illustrated in FIGS. 24A to 24C, while the insulating layer 121 is caused to remain, the first polymer portions 116a are selectively removed. After the removal of the first polymer portions 116a, the underlying layer 104 portions (104a) positioned underneath the first polymer portions 116a are also removed. In this way, cylindrical holes 122 making the upper surface of the interconnect layer 102 naked are made. The first polymer portions 116a can be removed by, for example, dry etching based on oxygen plasma.

Figure 25A:
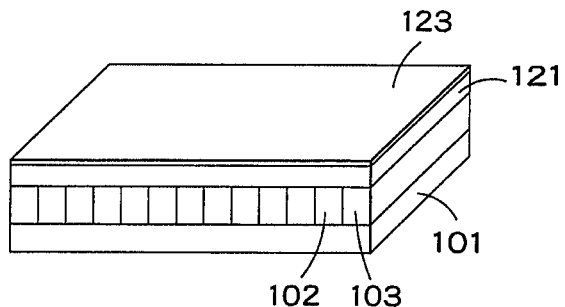
FIGS. 25A, 25B and 25C are views subsequent to FIGS. 24A, 24B and 24C.
Figure 25B:
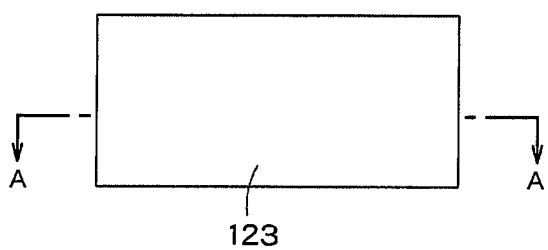
Figure 25C:
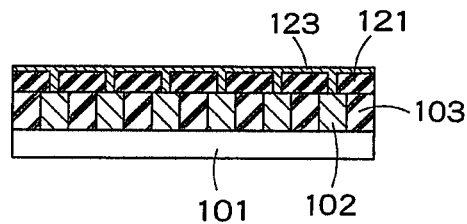

Next, as illustrated in FIGS. 25A to 25C, a conductive film 123 is formed to be buried in the holes 122. For the conductive film 123, use may be made of, for example, copper, aluminum, tungsten, or titanium.

Figure 26A:
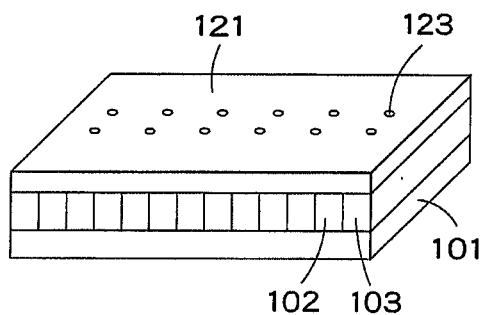
FIGS. 26A, 26B and 26C are views subsequent to FIGS. 25A, 25B and 25C.
Figure 26B:
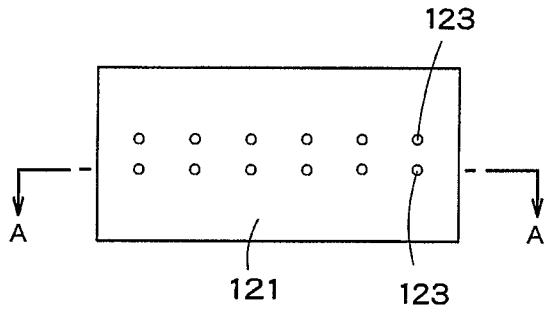
Figure 26C:
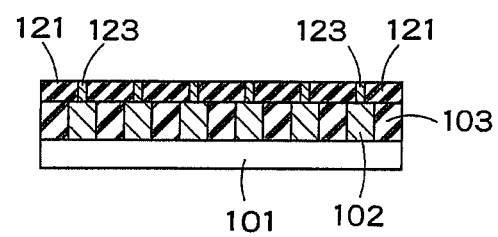

Next, as illustrated in FIGS. 26A to 26C, the conductive film 123 portions other than the film 123 portions in the holes 122 are removed. By, for example, CMP processing using the insulating layer 121 as a stopper, the conductive film 123 portions other than the film 123 portions in the holes 122 can be removed. The conductive film 123 buried in the holes 122 functions as contacts with interconnect layer 102.

In the same manner as in the first embodiment, in the present embodiment, at the time of exposing the underlying layer 104 to the light ray, reflective light from the interconnect layer 102 and/or evanescent light is/are used to change the surface state of the underlying layer 104 portions positioned on the interconnect layer 102. In other words, a pattern of the chemical guide layer based on the microphase separation of the block polymer layer 105 can be formed in the manner of self-alignment to (the patterned pieces of) the interconnect layer 102. For this reason, the position and the size of the chemical guide layer can be heightened in precision. Thus, the directed self-assembly phase 116 can be formed at a desired position. As a result, interconnect contacts can be formed with a high precision in position and size.

(Fifth Embodiment)

In the first embodiment, the underlying layer 104 is formed just on the interconnect layer 102 and the insulating layer 103, that is, is formed directly on the interconnect layer 102 and the insulating layer 103. However, an insulating layer may be further formed between the interconnect layer 102 and the insulating layer 103, and the underlying layer 104.

With reference to FIGS. 27A-27C to FIGS. 35A-35C, a description will be made about a pattern forming method according to the present embodiment (fifth embodiment) of the invention. In FIG. 27, as well as any other three figures with the same number out of FIG. 28 to FIG. 35, the figure with A is a perspective view, that with B is a top view, and that with C is a sectional view taken on line A-A in the figure B. To members or portions equivalent to those in the first embodiment are attached the same reference numbers, respectively; and detailed description thereof is omitted.

First, as illustrated in FIGS. 27A to 27C, patterned pieces of an interconnect layer 102 and patterned pieces of an insulating layer 103 are formed on a semiconductor substrate 101. The interconnect layer 102 constitutes a line-and-space pattern along a predetermined direction (vertical direction in FIG. 27B). An insulating layer 103 is formed in space areas (areas between the individual patterned pieces of the interconnect layer 102).

An insulating layer 130 is formed on the interconnect layer 102 and the insulating layer 103. For the insulating layer 130, use may be made of, for example, SiOC, SiOF, or a porous silicon material such as porous silica.

Next, as illustrated in FIGS. 28A to 28C, an underlying layer 104 is formed on the insulating layer 130.

Next, as illustrated in FIGS. 29A to 29C, a photomask (not illustrated) is used to expose predetermined regions R1 of the underlying layer 104 to a light ray. The light ray radiated onto the underlying layer 104 is reflected on the interconnect layer 102 and the insulating layer 103 underneath the underlying layer 104. The reflectivity of the light ray on the interconnect layer 102 is higher than that of the light ray on the insulating layer 103. For this reason, in the underlying layer 104 inside the predetermined regions R1, overlying portions 104a over the interconnect layer 102 are higher in photosensitivity than overlying portions 104b over the insulating layer 103. Accordingly, about the underlying layer 104, by exposing the predetermined regions R1 to the light ray, the surface state of the overlying portions 104a over the interconnect layer 102 and inside the predetermined regions R1 is changed while the surface state of the overlying portions 104b over the insulating layer 103 and inside the predetermined regions R1, as well as the surface state of an unexposed portion (region other than the predetermined regions R1) 104c, is not changed, or is scarcely changed.

As described above, through the step illustrated in FIGS. 29A to 29C, in the underlying layer 104, only the overlying portions 104a over the interconnect layer 102 and inside the exposed regions R1 are changed in surface state. The underlying layer 104 after the exposure treatment has a function as a chemical guide layer for controlling the following when a block copolymer to be formed in a subsequent step is to undergo microphase separation: the formation position of a pattern of the microphase separation.

Next, as illustrated in FIGS. 30A to 30C, a block copolymer is applied onto the underlying layer 104 to form a block polymer layer 105. The applied block copolymer may be, for example, a diblock copolymer wherein first polymer block chains are bonded to second polymer block chains. The diblock copolymer may be, for example, a block copolymer of polystyrene (PS) and polymethyl methacrylate (PMMA).

Next, as illustrated in FIGS. 31A to 31C, in the block polymer layer 105, a directed self-assembly phase 106 based on microphase separation is formed by, for example, heating treatment. The directed self-assembly phase 106 is in such a lamellar form that thin-plate-form first polymer portions 106a each containing one of the first polymer block chains, and thin-plate-form second polymer portions 106b each containing one of the second polymer block chains are alternately arranged. This lamellar directed self-assembly phase 106 is formed by a matter that the underlying layer 104, which has the portions 104a the surface state of which has been changed by the light exposure and the portions the surface state of which has been not changed, functions as a chemical guide layer. In regions having no chemical guide layer (the upper end region and the lower end region in FIG. 31B), no phase separation is not generated, so that the directed self-assembly phase 106 is not formed. Thus, these regions are kept in a disordered phase.

The average molecular weight of the first polymer block chains of the diblock copolymer applied, as well as that of the second polymer block chains thereof, is made into a value permitting the first polymer portions 106a to be formed on the portions 104a of the underlying layer 104, the surface state of the portions 104a having been changed by the light exposure. Moreover, the first polymer portions 106a are made lower than the second polymer portions 106b in etch resistance.

Next, as illustrated in FIGS. 32A to 32C, while the second polymer portions 106b and the block polymer layer (disordered phase) 105 are caused to remain, the first polymer portions 106a, which are relatively low in etch resistance, are selectively removed. After the removal of the first polymer portions 106a, the underlying layer 104 portions (104a) positioned underneath the first polymer portions 106a and the insulting layer 130 are also removed. In this way, holes 137 making the upper surface of the interconnect layer 102 naked are made.

Next, as illustrated in FIGS. 33A to 33C, the block polymer layer 105, the second polymer portions 106b, and the underlying layer 104 are removed. In this way, the surface of the insulating layer 130 is made naked.

Next, as illustrated in FIGS. 34A to 34C, a conductive film 138 is formed to be buried in the holes 137. For the conductive film 138, use may be made of, for example, copper, aluminum, tungsten or titanium.

Next, as illustrated in FIGS. 35A to 35C, conductive film 138 portions other than the film 138 portions in the holes 137 are removed. The conductive film 138 buried in the holes 137 functions as contacts with the interconnect layer 102. It is understood that the insulating layer 130 in the embodiment corresponds to the insulating layer 109 in the first embodiment.

As described above, in the embodiment, at the time of exposing the underlying layer 104 to the light ray, for example, reflective light from the interconnect layer 102 is used to change the surface state of the underlying layer 104 portions positioned above the interconnect layer 102. In other words, a pattern of the chemical guide layer based on the phase separation of the block polymer layer 105 can be formed in the manner of self-alignment to (the patterned pieces of) the interconnect layer 102. For this reason, the position and the size of the chemical guide layer can be heightened in precision. Thus, the directed self-assembly phase 106 can be formed as a desired directed self-assembly phase. Thus, interconnect contacts can be formed with a high precision in position and size.

(Sixth Embodiment)

In the fifth embodiment, the lamellar directed self-assembly phase 106 is formed by the microphase separation of the block polymer layer 105. However, a cylindrical directed self-assembly phase may be formed. The shape of the periodic structure of the directed self-assembly phase can be varied, for example, by changing the content ratio between first polymer block chains and second polymer block chains contained in the diblock copolymer.

With reference to FIGS. 36A-36C to FIGS. 40A-40C, a description will be made about a pattern forming method according to the present embodiment (sixth embodiment) of the invention. In FIG. 36, as well as any other three figures with the same number out of FIG. 37 to FIG. 40, the figure with A is a perspective view, that with B is a top view, and that with C is a sectional view taken on line A-A in the figure B.

The step of forming a block polymer layer 105 and steps before this step are the same as in the fifth embodiment (see FIG. 27 to FIG. 30); thus, description thereof is omitted.

After the formation of the block polymer layer 105, as illustrated in FIGS. 36A to 36C, a directed self-assembly phase 116 based on microphase separation is formed in the block polymer layer 105 by, for example, heating treatment. The directed self-assembly phase 116 has cylindrical first polymer portions 116a containing first polymer block chains, and second polymer portions 116b containing second polymer block chains and formed to surround the first polymer portions 116a. This directed self-assembly phase 116 is formed by a matter that the underlying layer 104 containing portions 104a the surface state of which has been changed by the light exposure function as a chemical guide layer. The directed self-assembly phase 116 is formed on the portions 104a of the underlying layer 104, these portions 104a having been changed in surface state by the light exposure, inside the predetermined regions R1. In regions where no chemical guide layer is formed (overlying regions on the underlying layer 104 portions the surface state of which has not been changed), no microphase separation is not generated, so that the directed self-assembly phase 116 is not formed. The first polymer portions 116a are made lower in etch resistance than the second polymer portions 116b, and the block polymer layer 105 wherein no microphase separation is caused (disordered phase 105).

Figure 37A:
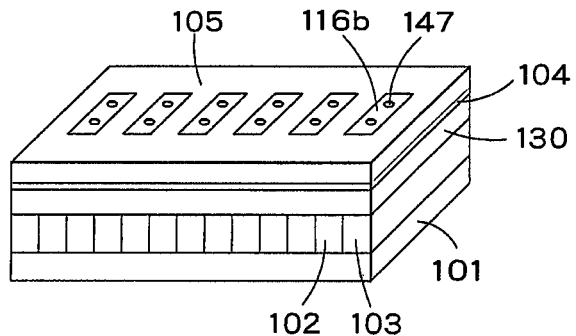
FIGS. 37A, 37B and 37C are views subsequent to FIGS. 36A, 36B and 36C.
Figures 37B, 37C:
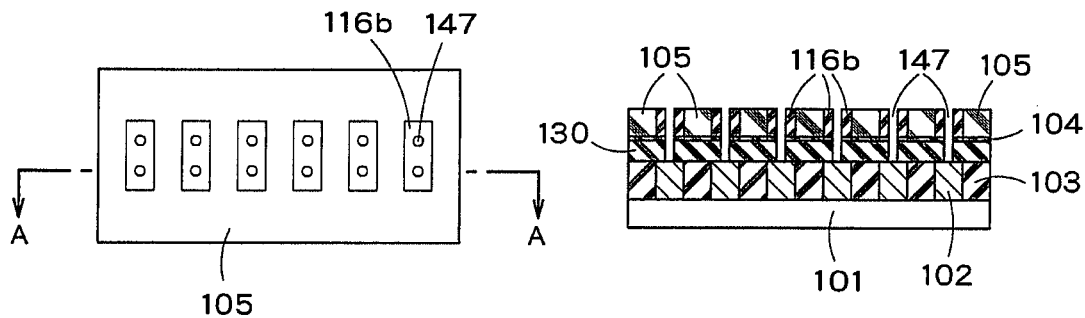

Next, as illustrated in FIGS. 37A to 37C, while the second polymer portions 116b, and the block polymer layer (disordered phase) 105 are caused to remain, the first polymer portions 116a, which are relatively low in etch resistance, are selectively removed. After the removal of the first polymer portions 116a, the underlying layer 104 portions (104a) positioned underneath the first polymer portions 116a and the insulating layer 130 are also removed. In this way, holes 147 making the upper surface of the interconnect layer 102 naked are made. For example, by dry etching based on oxygen plasma, the first block polymer portions 116a can be selectively removed.

Figure 38A:
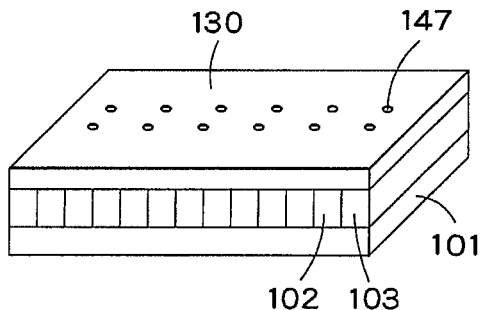
FIGS. 38A, 38B and 38C are views subsequent to FIGS. 37A, 37B and 37C.
Figures 38B, 38C:
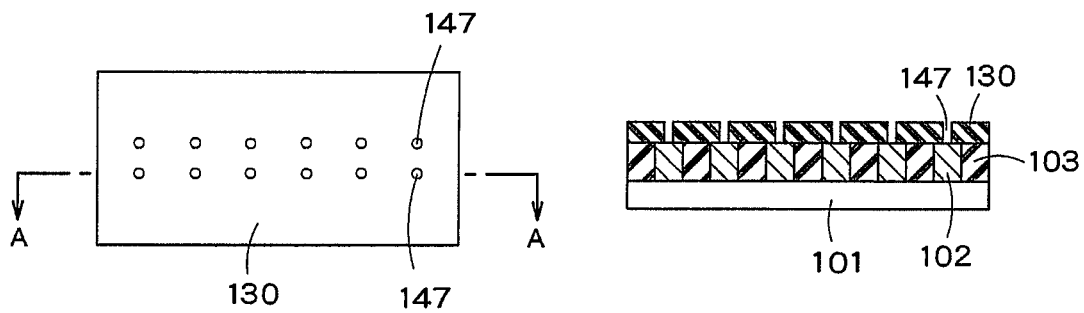

Next, as illustrated in FIGS. 38A to 38C, the block polymer layer 105, the second polymer portions 106b, and the underlying layer 104 are removed. In this way, the surface of the insulating layer 130, in which the holes 147 are made, is made naked.

Figure 39A:
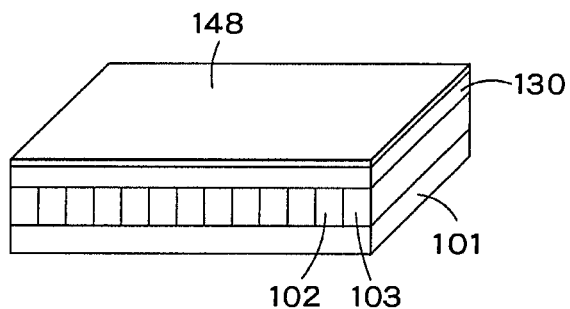
FIGS. 39A, 39B and 39C are views subsequent to FIGS. 38A, 38B and 38C.
Figures 39B, 39C:
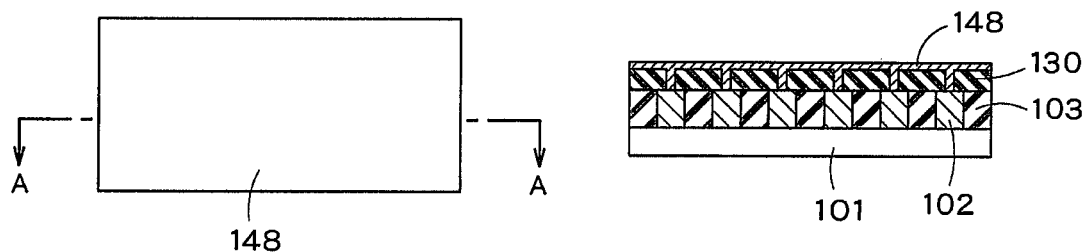

Next, as illustrated in FIGS. 39A to 39C, a conductive film 148 is formed to be buried in the holes 147. For the conductive film 148, use may be made of, for example, copper, aluminum, tungsten or titanium.

Figure 40A:
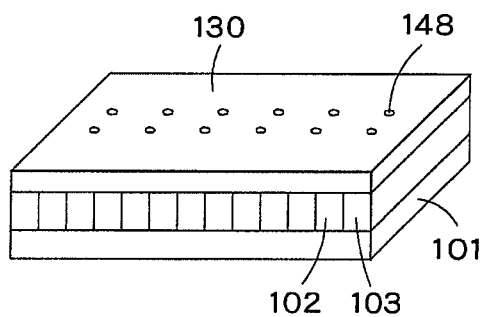
FIGS. 40A, 40B and 40C are views subsequent to FIGS. 39A, 39B and 39C.
Figures 40B, 40C:
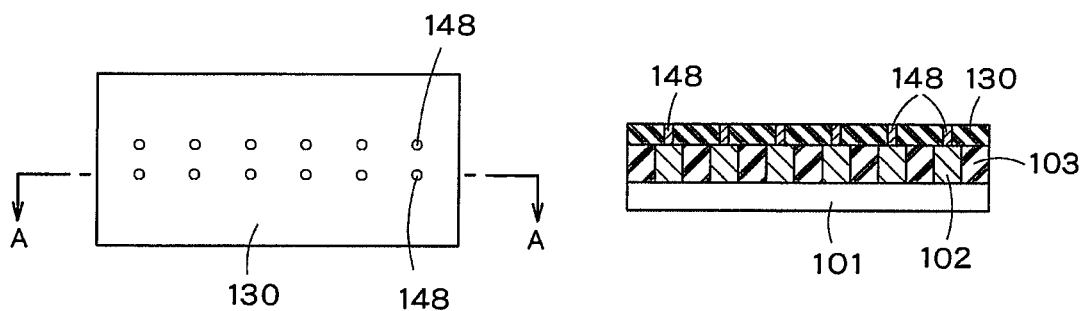

Next, as illustrated in FIGS. 40A to 40C, conductive film 148 portions other than the film 148 portions in the holes 147 are removed. The conductive film 148 buried in the holes 147 functions as contacts with the interconnect layer 102.

In the same manner as in the fifth embodiment, in the present embodiment, at the time of exposing the underlying layer 104 to the light ray, for example, reflective light from the interconnect layer 102 is used to change the surface state of the underlying layer 104 portions positioned above the interconnect layer 102. In other words, a pattern of the chemical guide layer based on the microphase separation of the block polymer layer 105 can be formed in the manner of self-alignment to (the patterned pieces of) the interconnect layer 102. For this reason, the position and the size of the chemical guide layer can be heightened in precision. Thus, the directed self-assembly phase 116 can be formed at a desired position. As a result thereof, interconnect contacts can be formed with a high precision in position and size.

(Seventh Embodiment)

In each of the first to sixth embodiments, the chemical guide layer is formed in a self-alignment manner. However, a physical guide layer may be formed. With reference to FIGS. 41A-41C to FIGS. 50A-50C, a description will be made about a method for forming a pattern containing a physical guide layer. In FIG. 41, as well as any other three figures with the same number out of FIG. 42 to FIG. 50, the figure with A is a perspective view, that with B is a top view, and that with C is a sectional view taken on line A-A in the figure B.

First, as illustrated in FIGS. 41A to 41C, plural patterned pieces of an interconnect layer 202 are formed on a semiconductor substrate 201. The interconnect layer 202 is, for example, a metal layer which is made of (or contains) copper, aluminum, tungsten, titanium, or an alloy containing one or more of these metals. The interconnect layer 202 constitutes a line-and-space pattern along a predetermined direction (vertical direction in FIG. 41B). An insulating layer 203 is formed in space areas (areas between the individual patterned pieces of the interconnect layer 202). For the insulating layer 203, use may be made of, for example, SiOC, SiOF, or a porous silicon material such as porous silica. For the insulating layer 203, an applied SOG (spin-on-glass) may be used.

An insulating layer 230 is formed on the interconnect layer 202 and the insulating layer 203. For the insulating layer 230, use may be made of, for example, SiOC, SiOF, or a porous silicon material such as porous silica.

Next, as illustrated in FIGS. 42A to 42C, an underlying guide layer 204 is formed on the interconnect layer 202 and the insulating layer 203. The underlying guide layer 204 is, for example, a positive photoresist film.

Next, as illustrated in FIGS. 43A to 43C, a light-shielding mask (not illustrated) is used to expose predetermined regions R2 of the underlying guide layer 204 to a light ray. The light ray radiated is a light ray to which the underlying guide layer 204 is photosensitive. The predetermined regions R2 includes regions where contacts with the interconnect layer 202 are to be formed.

The light ray radiated onto the underlying guide layer 204 is reflected on the interconnect layer 202 and the insulating layer 203 underneath the underlying guide layer 204. The reflectivity of the light ray on the interconnect layer 202 is higher than that of the light ray on the insulating layer 203. For this reason, in the underlying guide layer 204 inside the predetermined regions R2, overlying portions 204a over the interconnect layer 202 are higher in photosensitivity than overlying portions 204b over the insulating layer 203. Accordingly, about the underlying guide layer 204, by exposing the predetermined regions R2 to the light ray, the overlying portions 204a over the interconnect layer 202 and in the predetermined regions R2 turn soluble in a developing solution. Before or after the light exposure treatment, the workpiece may be subjected to baking treatment if necessary.

Next, as illustrated in FIGS. 44A to 44C, the workpiece is subjected to developing treatment to remove, from the underlying guide layer 204, the overlying portions 204a over the interconnect layer 202 and in the predetermined regions R2. In this way, holes 207 making the upper surface of the insulating layer 230 naked are made The developing solution may be a 2.38% solution of TMAH in water, a solution of TBAH in water, or an aqueous alkaline solution, such as an aqueous KOH solution. The developing solution may further contain additives such as a surfactant.

After the developing treatment, the underlying guide layer 204 may be subjected to treatment for making this layer insoluble in a solution containing a block polymer that will be detailed later. The treatment for the insolubility is, for example, EB curing, UV curing, hard baking, or painting of a protective film. In the EB curing, UV curing, or hard baking, protecting groups in the resist are decomposed to cause a shrinkage in the volume, or the temperature of the polymer (concerned) exceeds the glass transition temperature thereof, so that the holes 207 may be deformed. Thus, it is preferred for the treatment for the insolubility to apply an appropriate protective film. The protective film can be formed by applying a solution wherein a resin insoluble in a solvent of the solution containing the block polymer, which will be detailed later, is dissolved in a solvent wherein the resist is insoluble. When the solvent of the solution containing the block polymer is, for example, cyclohexanone, the protective film can be formed by use of a solution wherein a thermally crosslinkable polymer is dissolved in a higher alcohol such as 4-methyl-2-pentanol, which is insoluble in the resist.

Next, as illustrated in FIGS. 45A to 45C, a block polymer is applied onto the underlying guide layer 204 to be buried in the holes 207, thereby forming a block polymer layer 205. The applied block polymer may be, for example, a diblock copolymer wherein first polymer block chains are bonded to second polymer block chains. The diblock copolymer may be, for example, a block copolymer of polystyrene (PS) and polymethyl methacrylate (PMMA).

Next, as illustrated in FIGS. 46A to 46C, the workpiece is subjected to, for example, heating treatment to form, in the holes 207, a directed self-assembly phase 216 based on microphase separation of the block polymer layer 205. The directed self-assembly phase 216 has cylindrical first polymer portions 216a containing first polymer block chains, and second polymer portions 216b containing second polymer block chains and formed to surround the respective first polymer portions 216a. The underlying guide layer 204 formed in the holes 207 functions as a physical guide layer for the microphase separation of the block polymer layer 205.

The first polymer portions 216a are made lower in etch resistance than the second polymer portions 216b.

Figure 47A:
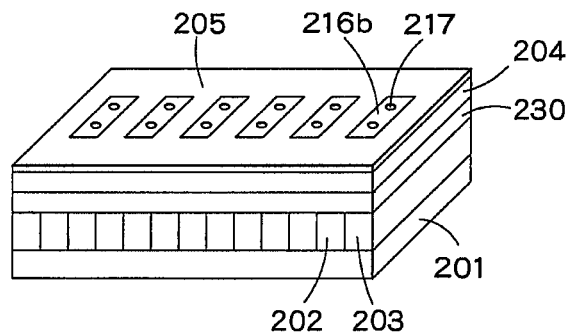
FIGS. 47A, 47B and 47C are views subsequent to FIGS. 46A, 46B and 46C.
Figure 47B:
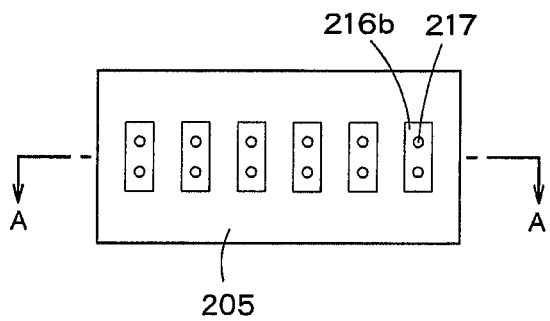
Figure 47C:
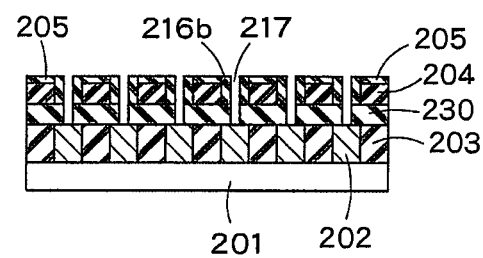

Next, as illustrated in FIGS. 47A to 47C, while the second polymer portions 216b and the block polymer layer (disordered phase) 205 are caused to remain, the first polymer portions 216a, which are relatively low in etch resistance, are selectively removed. After the removal of the first polymer portions 216a, the insulating layer 230 portions positioned underneath the first polymer portions 216a are also removed. In this way, holes 217 making the upper surface of the interconnect layer 202 naked are made.

Figure 48A:
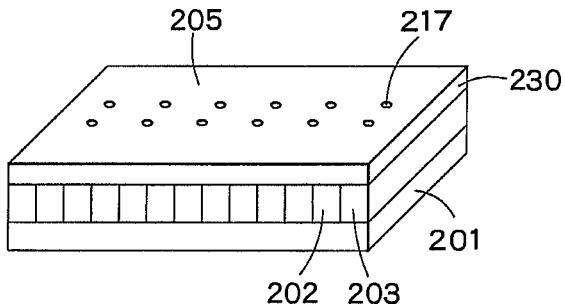
FIGS. 48A, 48B and 48C are views subsequent to FIGS. 47A, 47B and 47C.
Figure 48B:
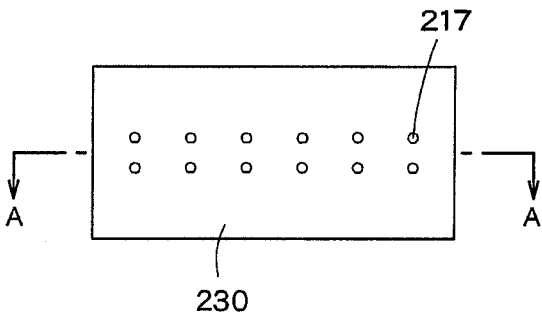
Figure 48C:
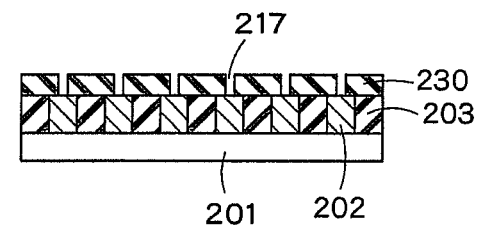

Next, as illustrated in FIGS. 48A to 48C, the block polymer layer 205, the second polymer portions 206b, and the underlying guide layer 204 are removed. In this way, the upper surface of the insulating layer 230, wherein the holes 217 are made, is made naked.

Figure 49A:
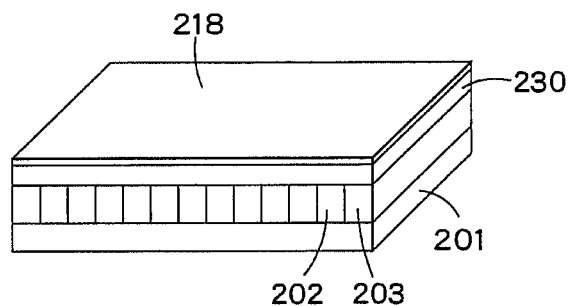
FIGS. 49A, 49B and 49C are views subsequent to FIGS. 48A, 48B and 48C.
Figures 49B, 49C:
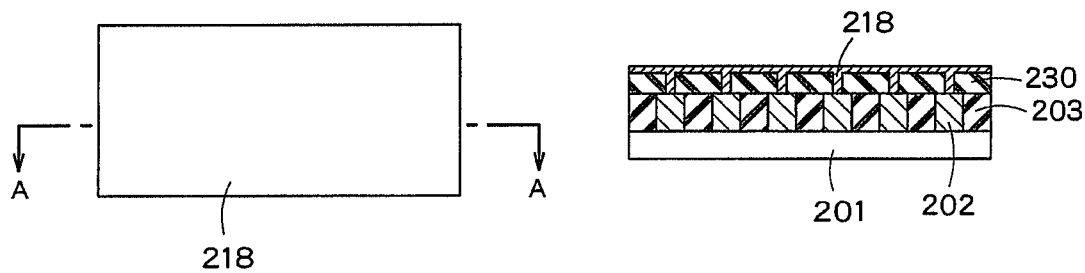

Next, as illustrated in FIGS. 49A to 49C, a conductive film 218 is formed to be buried in the holes 217. For the conductive film 218, use may be made of, for example, copper, aluminum, tungsten or titanium.

Figure 50A:
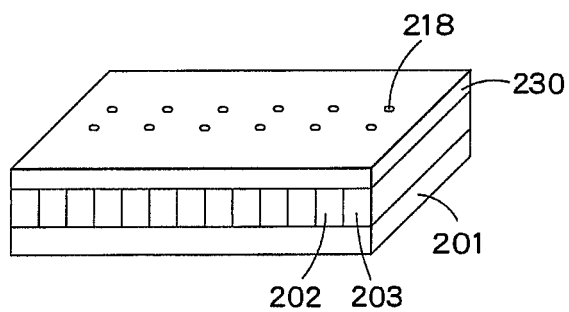
FIGS. 50A, 50B and 50C are views subsequent to FIGS. 49A, 49B and 49C.
Figures 50B, 50C:
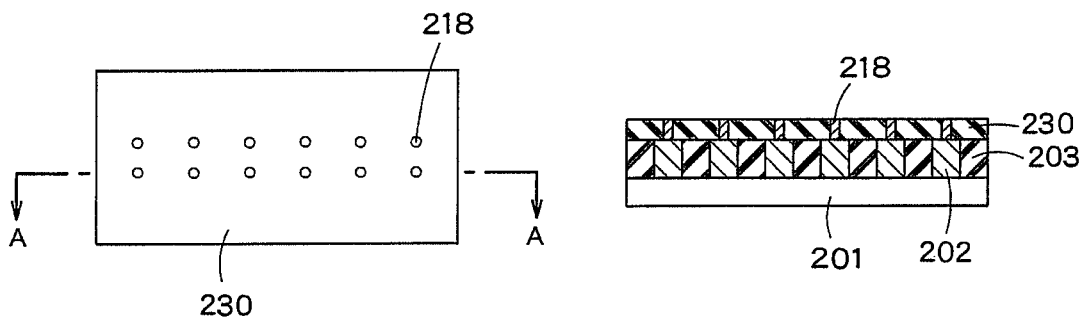

Next, as illustrated in FIGS. 50A to 50C, conductive film 218 portions other than the film 218 portions in the holes 217 are removed. The conductive film 218 buried in the holes 217 functions as contacts with the interconnect layer 202.

In the present embodiment, at the time of exposing the underlying guide layer 204 to the light ray, light reflected from the interconnect layer 202 is used to make high the photosensitivity of the underlying guide layer 204 portions positioned above the interconnect layer 202, and then by the developing treatment, the holes 207 can be made in the overlying portions over the interconnect layer 202. In other words, a pattern of the physical guide layer based on the microphase separation of the block polymer layer 205 can be formed in the manner of self-alignment to (the patterned pieces of) the interconnect layer 202. For this reason, the position and the size of the physical guide layer can be heightened in precision. Thus, the directed self-assembly phase 216 can be formed at a desired position. As a result thereof, interconnect contacts can be formed with a high precision in position and size.

In the seventh embodiment, it is allowable to omit the insulating layer 230 and form the underlying guide layer 204 directly on the interconnect layer 202 and the insulating layer 203. In this case, while the second polymer portions 216b and the block polymer layer 205 are caused to remain, the first polymer portions 216a, which are relatively low in etch resistance, are selectively removed to make holes, and subsequently a conductive film is buried in the holes, thereby forming contacts with the interconnect layer 202. Thereafter, while the conductive film is caused to remain, the second polymer portions 216b, the block polymer layer 205, and the underlying guide layer 204 are removed. An insulating layer is then formed to cover the conductive film.

In the seventh embodiment, it is allowable to omit the insulating layer 230, form the underlying guide layer 204 directly on the interconnect layer 202 and the insulating layer 203, and further make the first polymer portions 116a relatively high in etch resistance. In this case, after the formation of the directed self-assembly phase 116, while the first polymer portions 116a are caused to remain, the second polymer portions 216b, the block polymer layer (disordered phase) 205, and the underlying guide layer 204 are removed. An insulating layer is then formed to surround the periphery of the first polymer portions 116a, and subsequently while this insulating layer is caused to remain, the first polymer portions 216a are selectively removed to make holes. A conductive film is then buried in the holes to form contacts with the interconnect layer 202.

In the seventh embodiment, it is allowable to omit the insulating layer 230, use, as the matter of the underlying guide layer 204, a photosensitive insulating film, and further use, as the material of the block polymer layer 205, a material permitting the formation of the directed self-assembly phase 216 which is a phase having cylindrical organic microphases, and insulating microphases surrounding the respective organic microphases. The photosensitive insulating film may be, for example, a photosensitive Low-k film. The material of the block polymer layer 205 may be, for example, a material composed of an organic block polymer, and a silicon-containing block polymer having a siloxane structure or some other structures; examples of this material include a mixture of PS-PDMS diblock copolymer and PDMS polymer, and a mixture of PS-PEO diblock copolymer and PEO polymer. In the directed self-assembly phase, the silicon-containing microphases exhibit electrically insulating property. The disordered phase wherein no microphase separation is caused also exhibits electrically insulating property. In the above-mentioned material, the PS microphases form the cylindrical microphases; thus, the block polymer of PDMS or PEO (plus polymer additives) is rendered a material larger in the number of monomer molecules than the PS block polymer. The PS microphases, which are organic microphases, are lower in etch resistance than PEO or PDMS.

By the use of such a material for the underlying guide layer 204 and the block polymer layer 205, the underlying guide layer 204, the block polymer layer 205, and the second polymer portions 216b are each to be an insulating layer; thus, it is unnecessary to remove the first polymer portions 116a to make holes, bury a conductive film in the holes to form contacts with the interconnect layer 202, and then remove the underlying guide layer 204, the block polymer layer 205 and the second polymer portions 216b. As a result, the number of steps can be reduced.

In the seventh embodiment, the cylindrical directed self-assembly phase is formed. However, a lamellar directed self-assembly phase may be formed.

In each of the first to seventh embodiments, contacts with the interconnect layer 102 or the interconnect layer 202 are formed. However, the present invention can be applied to a pattern wherein a contact with a metal film other than interconnect layers is formed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern forming method, comprising:
    forming, on a metal layer and an insulating layer each having a predetermined pattern, an underlying layer the surface state of which is changeable by irradiation with a light ray,
    radiating the light ray to a predetermined region of the underlying layer, thereby changing the surface state of a portion of the predetermined region which is a portion above the metal layer, forming a block polymer layer on the underlying layer after the radiation of the light ray, forming, in a region of the block polymer layer above the predetermined region of the underlying layer, a directed self-assembly phase which contains a first polymer portion and a second polymer portion, the first polymer portion being positioned above the underlying layer portion the surface state of which has been changed by the radiation of the light ray, removing the first polymer portion, and the underlying layer portion underneath the first polymer portion to make a hole, and burying a conductive film into the hole.

2. The pattern forming method according to claim 1, wherein while the second polymer portion is caused to remain, the first polymer portion, and the underlying layer portion underneath the first polymer portion are removed to make the hole.

3. The pattern forming method according to claim 2, wherein the second polymer portion comprises an electrically insulating material.

4. The pattern forming method according to claim 1, wherein after the formation of the directed self-assembly phase and before the making of the hole, while the first polymer portion is caused to remain, a region of the underlying layer which is not irradiated with the light ray, a region of the block polymer on this underlying layer region not irradiated with the light ray, the second polymer portion, and a portion of the underlying layer which is a portion underneath the second polymer portion, and a second insulating layer is formed to surround the first polymer portion.

5. The pattern forming method according to claim 2, wherein the metal layer constitutes metal interconnects which form a line-and-space pattern.

6. The pattern forming method according to claim 5, wherein the wavelength of the light ray radiated to the predetermined region of the underlying layer is ½ of the pitch of the metal interconnects, or more.

7. The pattern forming method according to claim 5, wherein the light ray radiated to the predetermined region of the underlying layer has TM polarizability in a direction perpendicular to a direction along which the metal interconnects are extended.

8. The pattern forming method according to claim 1, wherein the first polymer portion has a cylindrical shape, and the second polymer portion is formed to surround the first polymer portion.

9. The pattern forming method according to claim 1, wherein the second polymer portion is formed above the insulating layer.

10. The pattern forming method according to claim 1, wherein the underlying layer is a laminated film of a self-assembled monolayer, and a polymer layer.

11. The pattern forming method according to claim 10, wherein the self-assembled monolayer comprises a silane coupling agent containing a benzophenone skeleton, and the polymer layer comprises an acrylic resin derivative.

12. A pattern forming method, comprising:

forming, on a metal layer and a first insulating layer each having a predetermined pattern, a second insulating layer, forming, on the second insulating layer, an underlying layer the surface state of which is changeable by irradiation with a light ray, radiating the light ray to a predetermined region of the underlying layer, thereby changing the surface state of a portion of the predetermined region which is a portion above the metal layer, forming a block polymer layer on the underlying layer after the radiation of the light ray, forming, in a region of the block polymer layer on the predetermined region of the underlying layer, a directed self-assembly phase which contains a first polymer portion and a second polymer portion, the first polymer portion being positioned above the underlying layer portion the surface state of which has been changed by the radiation of the light ray, removing the first polymer portion to form a hole pattern, using, as a mask, the block polymer layer in which the hole pattern is made to process the underlying layer and the second insulating layer, thereby transferring the hole pattern to the second insulating layer, removing the block polymer layer and the underlying layer after the processing of the second insulating layer, and burying a conductive film into the hole pattern of the second insulating layer.

13. The pattern forming method according to claim 12, wherein the second polymer portion is formed above the first insulating layer.

14. The pattern forming method according to claim 12, wherein the metal layer constitutes metal interconnects which form a line-and-space pattern, and the first insulating layer is formed in the space(s) in the line-and-space pattern.

15. The pattern forming method according to claim 12, wherein the first polymer portion has a cylindrical shape, and the second polymer portion is formed to surround the first polymer portion.

16. A pattern forming method, comprising:

forming, on a metal layer and a first insulating layer each having a predetermined pattern, a second insulating layer, forming a resist film on the second insulating layer, removing a portion of the resist film that is positioned above the metal layer and in a predetermined region of the resist film by light exposing treatment and developing treatment, thereby forming a first hole pattern, forming a block polymer layer in the first hole pattern, forming, in the block polymer layer, a first polymer portion having a cylindrical structure and a second polymer portion surrounding the first polymer portion, removing the first polymer portion to form a second hole pattern, using, as a mask, the resist film, and the block polymer layer in which the second hole pattern is formed to process the second insulating layer, thereby forming a third hole pattern in the second insulating layer, removing the resist film and the block polymer layer after the working of the second insulating layer, and burying a conductive film into the third hole pattern of the second insulating layer.

17. The pattern forming method according to claim 16, wherein baking treatment is performed before and/or after the light exposing treatment.

18. The pattern forming method according to claim 16, wherein after the developing treatment and before the formation of the block polymer layer, EB curing, UV curing, hard baking, or painting of protective film is applied to the resist film.

19. The pattern forming method according to claim 16, wherein the metal layer constitutes metal interconnects which form a line-and-space pattern, and the first insulating layer is formed in the space(s) in the line-and-space pattern.

* * * * *